(12) United States Patent
Kim et al.

(10) Patent No.: US 10,497,460 B2
(45) Date of Patent: Dec. 3, 2019

(54) SEMICONDUCTOR MEMORY DEVICES, METHODS OF OPERATING SEMICONDUCTOR MEMORY DEVICES AND MEMORY SYSTEMS

(71) Applicant: SAMSUNG ELECTRONICS CO., LTD., Suwon-si (KR)

(72) Inventors: Kyung-Ryun Kim, Seoul (KR); Hyun-Chul Yoon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/023,584

(22) Filed: Jun. 29, 2018

(65) Prior Publication Data

US 2019/0096508 A1 Mar. 28, 2019

(30) Foreign Application Priority Data

Sep. 26, 2017 (KR) ........................ 10-2017-0124231

(51) Int. Cl.
| | | |
|---|---|---|
| *G11C 7/00* | (2006.01) | |
| *G11C 29/00* | (2006.01) | |
| *G11C 11/4076* | (2006.01) | |
| *G11C 11/408* | (2006.01) | |
| *G11C 11/4094* | (2006.01) | |

(Continued)

(52) U.S. Cl.
CPC .............. *G11C 29/808* (2013.01); *G11C 7/08* (2013.01); *G11C 8/06* (2013.01); *G11C 8/08* (2013.01); *G11C 11/4076* (2013.01); *G11C 11/4082* (2013.01); *G11C 11/4087* (2013.01); *G11C 11/4091* (2013.01); *G11C 11/4094* (2013.01); *G11C 11/418* (2013.01); *G11C 29/1201* (2013.01); *G11C 29/76* (2013.01); *G11C 29/785* (2013.01); *G11C 29/787* (2013.01); *G11C 29/81* (2013.01); *G11C 29/816* (2013.01); *G11C 8/16* (2013.01); *G11C 11/4085* (2013.01); *G11C 2029/1202* (2013.01); *G11C 2207/005* (2013.01)

(58) Field of Classification Search
CPC ........ G11C 2029/4402; G11C 16/0441; G11C 16/26; G11C 2216/10; G11C 11/40622; G11C 29/44; G11C 29/787; G11C 29/84; G11C 11/005; G11C 11/40; G11C 11/402; G11C 11/403
USPC ............ 365/185.24, 185.03, 185.05, 185.14, 365/185.18, 185.26, 200, 202, 222, 225.7, 365/230.03
See application file for complete search history.

(56) References Cited

U.S. PATENT DOCUMENTS 6,414,896 B1   7/2002   Kim et al.
6,646,934 B2  11/2003   Sakata
(Continued)

FOREIGN PATENT DOCUMENTS

KR   10-2005-0037144 A   4/2005

*Primary Examiner* — Thong Q Le
(74) *Attorney, Agent, or Firm* — Sughrue Mion, PLLC

(57) ABSTRACT

A semiconductor memory device may include a memory cell array and an access control circuit. The memory cell array may include a first cell region and a second cell region. The access control circuit may access the first cell region and the second cell region differently in response to a command, an access address and fuse information to identify the first cell region and the second cell region. The command and the address may be provided from an external device.

20 Claims, 23 Drawing Sheets

(51) Int. Cl.
*G11C 11/4091* (2006.01)
*G11C 7/08* (2006.01)
*G11C 8/06* (2006.01)
*G11C 8/08* (2006.01)
*G11C 11/418* (2006.01)
*G11C 29/12* (2006.01)
*G11C 8/16* (2006.01)

(56) References Cited

U.S. PATENT DOCUMENTS

| | | |
|---|---|---|
| 6,950,351 B2 | 9/2005 | Lim |
| 7,061,816 B2 | 6/2006 | Sugiura et al. |
| 7,634,695 B2 | 12/2009 | Doi |
| 8,296,606 B2 | 10/2012 | Blodgett |
| 8,713,382 B2 | 4/2014 | Tabata |
| 2017/0262647 A1* | 9/2017 | Iwai .................... G06F 21/6218 |

* cited by examiner

SEMICONDUCTOR MEMORY DEVICES, METHODS OF OPERATING SEMICONDUCTOR MEMORY DEVICES AND MEMORY SYSTEMS

CROSS-REFERENCE TO RELATED APPLICATION

This application claims priority from Korean Patent Application No. 10-2017-0124231, filed on Sep. 26, 2017, in the Korean Intellectual Property Office, the disclosure of which is incorporated by reference in its entirety herein.

BACKGROUND

1. Field

Apparatuses and methods consistent with example embodiments relate to memories, and more particularly to semiconductor memory devices, methods of operating semiconductor memory devices and memory systems.

2. Description of the Related Art

Semiconductor chips are manufactured through semiconductor manufacturing processes, and then tested by a test device in a wafer, a die, or a package state. Defective portions of defective chips are selected through a test, and if some of memory cells are defective, repairs are performed to save semiconductor chips. Currently, semiconductor chips such as dynamic random access memories (DRAMs) have continued decrease in size through precision manufacturing process, and accordingly, possibility of introducing defects during the manufacturing process has also increased. In addition, if defects are not detected through the initial testing process, errors may occur during chip operations.

SUMMARY

Example embodiments may provide a semiconductor memory device capable of increasing flexibility of column repair operation.

Example embodiments may provide a memory system including a semiconductor memory device capable of increasing flexibility of column repair operation.

Example embodiments may provide a method of operating a semiconductor memory device, capable of increasing flexibility of column repair operation.

According to an aspect of an example embodiment, a semiconductor memory device may include a memory cell array and an access control circuit. The memory cell array may include a first cell region and a second cell region. The access control circuit may be configured to access the first cell region and the second cell region differently in response to a command, an access address and fuse information to identify the first cell region and the second cell region. The command and the access address may be provided from an external device.

According to an aspect of an example embodiment, a method of operating a semiconductor memory device may be provided, where the semiconductor memory device includes a memory cell array including a first cell region and a second cell region. The method may include receiving a command and an access address from an external device, determining whether the access address accesses the first cell region or the second cell region and accessing the first cell region and the second cell region differently based on the determining and fuse information to identify the first cell region and the second cell region.

According to an aspect of an example embodiment, a memory system may include at least one semiconductor memory device and a memory controller that controls the at least one semiconductor memory device. The at least one semiconductor memory device may include a memory cell array and an access control circuit. The memory cell array may include a first cell region and a second cell region. The access control circuit may access the first cell region and the second cell region differently in response to a command, an access address and fuse information to identify the first cell region and the second cell region. The command and the access address may be provided from the memory controller.

Accordingly, a semiconductor memory device may perform a column repair operation by simultaneously activating a word-line coupled to at least one defective cell and another word-line associated with the word-line based on a fuse information to identify a first cell region and a second cell region when the semiconductor memory device repairs the at least one defective cell in the second cell region. Therefore, the semiconductor memory device may increase flexibility when performing the column repair operation.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
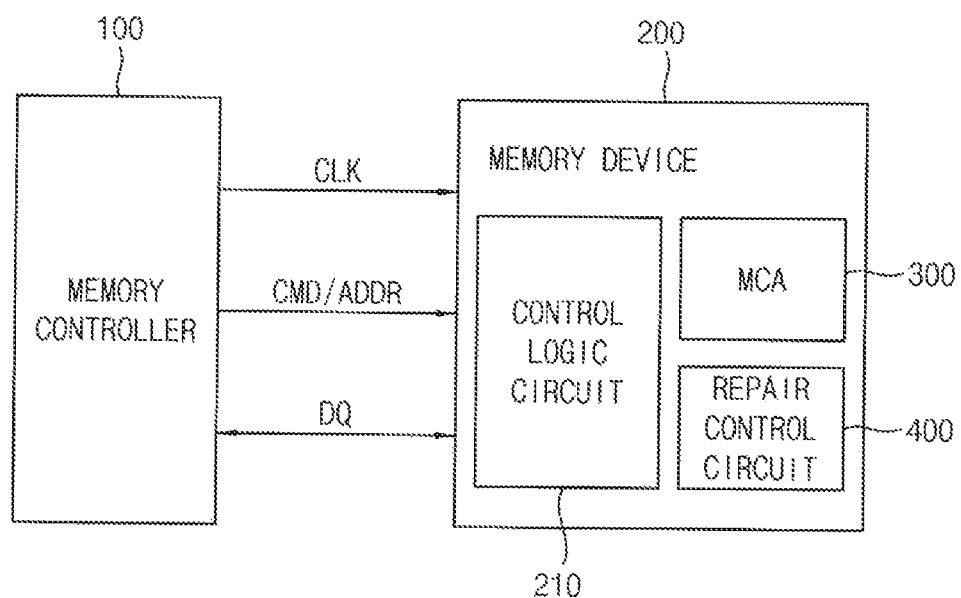
FIG. 1 is a block diagram illustrating a memory system according to an example embodiment.

Reference will now be made in detail to example embodiments, with reference to the accompanying drawings. In the drawings, parts irrelevant to the description are omitted to clearly describe the exemplary embodiments, and like reference numerals refer to like elements throughout the specification. In this regard, the present example embodiments may have different forms and should not be construed as being limited to the descriptions set forth herein.

FIG. 1 is a block diagram illustrating a memory system according to an example embodiment.

Referring to FIG. 1, a memory system 20 may include a memory controller 100 and a semiconductor memory device 200. Various components and modules depicted in FIG. 1 and other figures may be implemented with hardware (e.g., circuits, microchips, processors, etc.), software (e.g., logic, application programs, firmware, etc.) or a combination of both hardware and software.

The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200.

In some example embodiments, the semiconductor memory device 200 may be a memory device including dynamic memory cells such as a dynamic random access memory (DRAM), double data rate 4 (DDR4) synchronous DRAM (SDRAM), a low power DDR4 (LPDDR4) SDRAM or a LPDDR5 SDRAM.

The memory controller 100 may transmit a clock signal CLK, a command CMD and an address (signal) ADDR to the semiconductor memory device 200 and exchange data DQ with the semiconductor memory device 200.

The semiconductor memory device 200 may include a memory cell array 300 that stores the data DQ, a control logic circuit 210 and a repair control circuit 400. The memory cell array 300 may include a first cell region and a second cell region which are identified based on fuse information. The memory cell array 300 may further include a third cell region which is not associated with the fuse information.

The control logic circuit 210 may control an access to the memory cell array 300 based on the command CMD and the address ADDR, and the repair control circuit 400 may access the first cell region and the second cell region differently based on the address ADDR and the fuse information. The fuse information may be set by units of sub-array blocks constituting the memory cell array 300.

The repair control circuit 400 may perform a repair operation by enabling a first number of word-lines when accessing the first cell region and by enabling a second number of word-lines when accessing the second cell region, based on the fuse information. The first number may be different from (or smaller than) the second number. Therefore, the semiconductor memory device 200 may increase flexibility when performing a column repair operation.

Figure 2A:
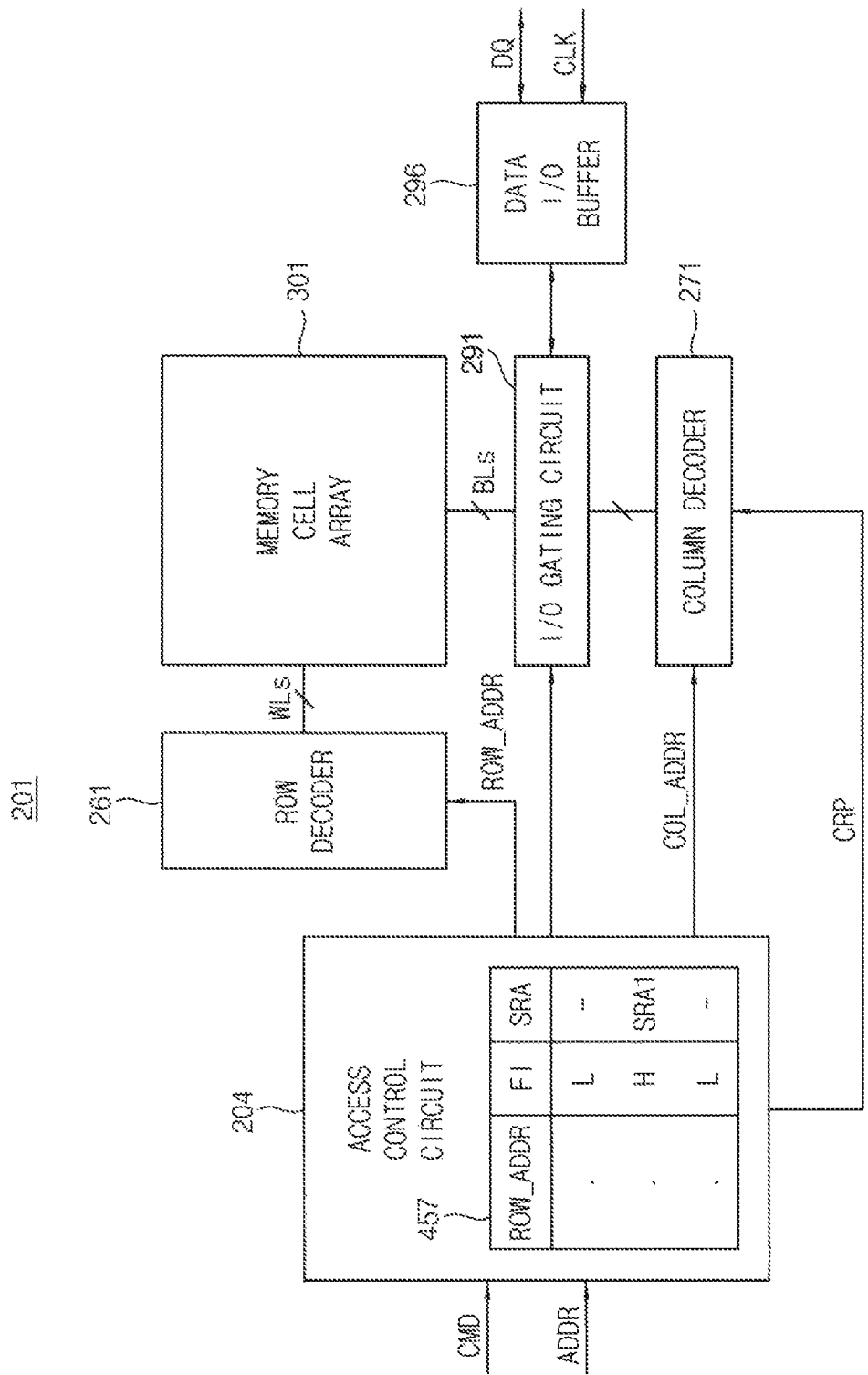
FIG. 2A is a block diagram illustrating an example of the semiconductor memory device in FIG. 1 according to an example embodiment.

FIG. 2A is a block diagram illustrating an example of the semiconductor memory device in FIG. 1 according to an example embodiment.

Referring to FIG. 2A, a semiconductor memory device 201 may include an access control circuit 204, a row decoder 261, a column decoder 271, an input/output (I/O) gating circuit 291, a data I/O buffer 296 and a memory cell array 301.

The access control circuit 204 may receive the command CMD and the access address ADDR. The access control circuit 204 may decode the command CMD for controlling operation of the semiconductor memory device 201. The access control circuit 204 may provide the row decoder 261 with a row address ROW_ADDR of the access address ADDR, and provide the column decoder 271 with a column address COL_ADDR of the access address ADDR. The access control circuit 204 may compare the access address ADDR with an address of at least one defective cell, and provide the column decoder 271 with the column repair signal CRP based on a result of the comparison. The access control circuit 204 may include a fuse information circuit 457 that stores fuse information FI, the row address ROW_ADDR and a spare row address SRA. The fuse information FI may identify a cell region to which the at least one defective cell belongs. That is, the access control circuit 204 may determine to activate a first cell region and a second cell region simultaneously or activate one of the first cell region and a second cell region based on the access address ADDR and the fuse information FI that identifies the first cell region and the second cell region. When the access control circuit 204 determines to activate the first cell region and the second cell region simultaneously, the access control circuit 204 may repair a defective cell in the second cell region by a normal cell in the first cell region.

The row decoder 261 may be coupled to the memory cell array 301 through word-lines WLs and the column decoder 271, and the I/O gating circuit 291 may be coupled to the memory cell array 301 through bit-lines BLs. The data I/O buffer 296 may receive/transmit data DQ with the memory controller 100 through the I/O gating circuit 291.

Figure 2B:
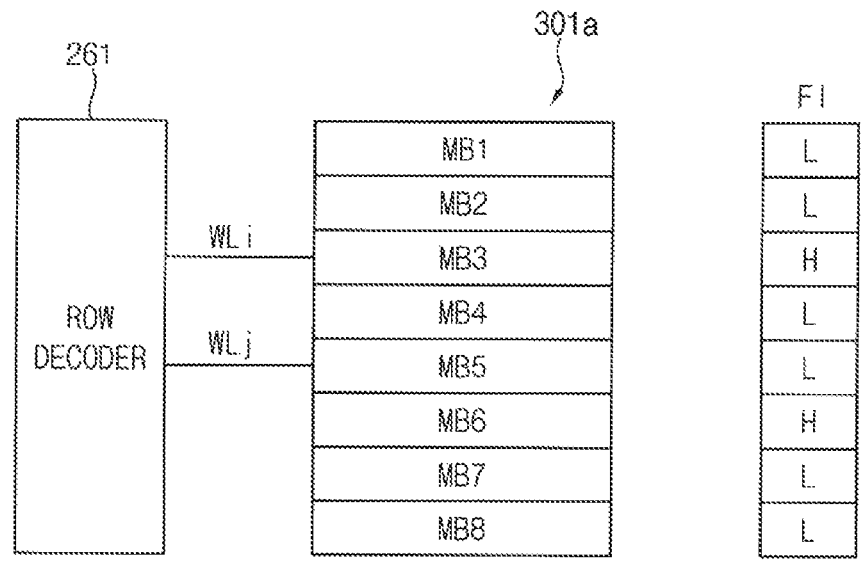
FIG. 2B illustrates an example of the memory cell array in the semiconductor memory device of FIG. 2A according to an example embodiment.

FIG. 2B illustrates an example of the memory cell array in the semiconductor memory device of FIG. 2A according to an example embodiment.

In FIG. 2B, the row decoder 261 and the fuse information FI are illustrated along with a memory cell array 301*a*.

Referring to FIG. 2B, the memory cell array 301a may include a plurality of memory blocks MB1-MB8. Since the fuse information FI of each of the memory blocks MB1, MB2, MB4, MB5, MB7 and MB8 is a low level (e.g., a first logic level), the memory blocks MB1, MB2, MB4, MB5, MB7 and MB8 may correspond to the first cell region. Since the fuse information FI of each of the memory blocks MB3 and MB6 is a high level (e.g., a second logic level), the memory blocks MB3 and MB6 may correspond to the second cell region.

When the row address ROW_ADDR of the access address ADDR designates the memory block MB3 in the second cell region, the row decoder 261 may perform the repair operation by simultaneously enabling a first word-line WLi of the memory block MB3 and a second word-line WLj of the memory block MB5 associated with repair operation of the first word-line WLi. The second word-line may be assigned to a memory block in the first cell region or may be assigned to a memory block in the second cell region. The second word-line, which is enabled simultaneously with the first word-line WLi may be one of word-lines in the first cell region and word-lines in the second cell region. When the second word-line belongs to one of the memory blocks MB3 and MB6 in the second cell region, the second word-line may belong to the memory block MB6 instead of the memory block MB3 to which the first word-line WLi belongs. That is, the second number of word-lines corresponds to a set of word-lines among all word-lines included in the first cell region and the second cell region.

Figure 2C:
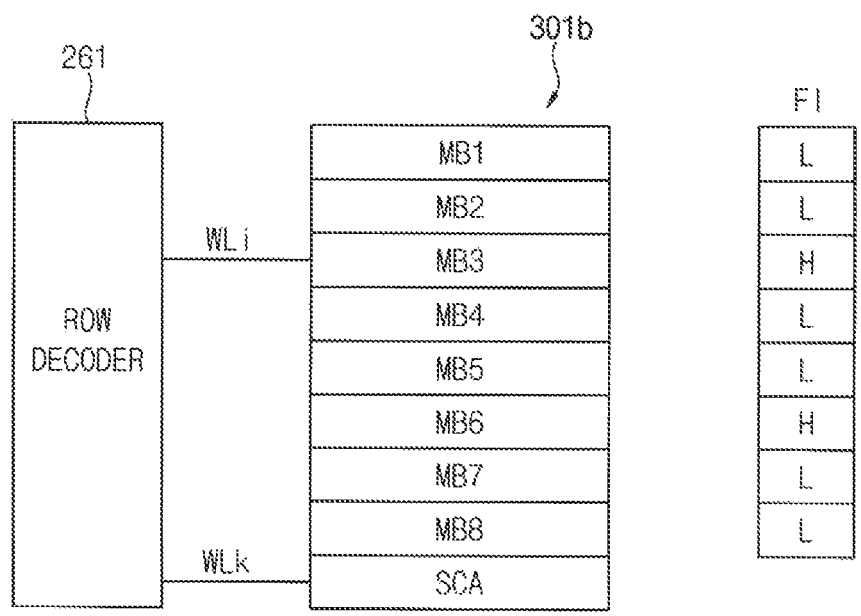
FIG. 2C illustrates another example of the memory cell array in the semiconductor memory device of FIG. 2A according to an example embodiment.

FIG. 2C illustrates another example of the memory cell array in the semiconductor memory device of FIG. 2A according to an example embodiment.

A memory cell array 301b in FIG. 2C may differ from the memory cell array 301a in FIG. 2B in that the memory cell array 301b may further include a spare cell array SCA.

When the row address ROW_ADDR of the access address ADDR designates the memory block MB3 in the second cell region, the row decoder 261 may perform the repair operation by simultaneously enabling a first word-line WLi of the memory block MB3 and a second word-line WLk of the spare cell array SCA associated with repair operation of the first word-line WLi. The second word-line, which is enabled simultaneously with the first word-line WLi may be one of word-lines in the first cell region, word-lines in the second cell region and word-lines in the spare cell region (or a third cell region). That is, the second number of word-lines corresponds to a set of word-lines among all word-lines included in the first cell region, the second cell region and the third cell region.

Figure 2D:
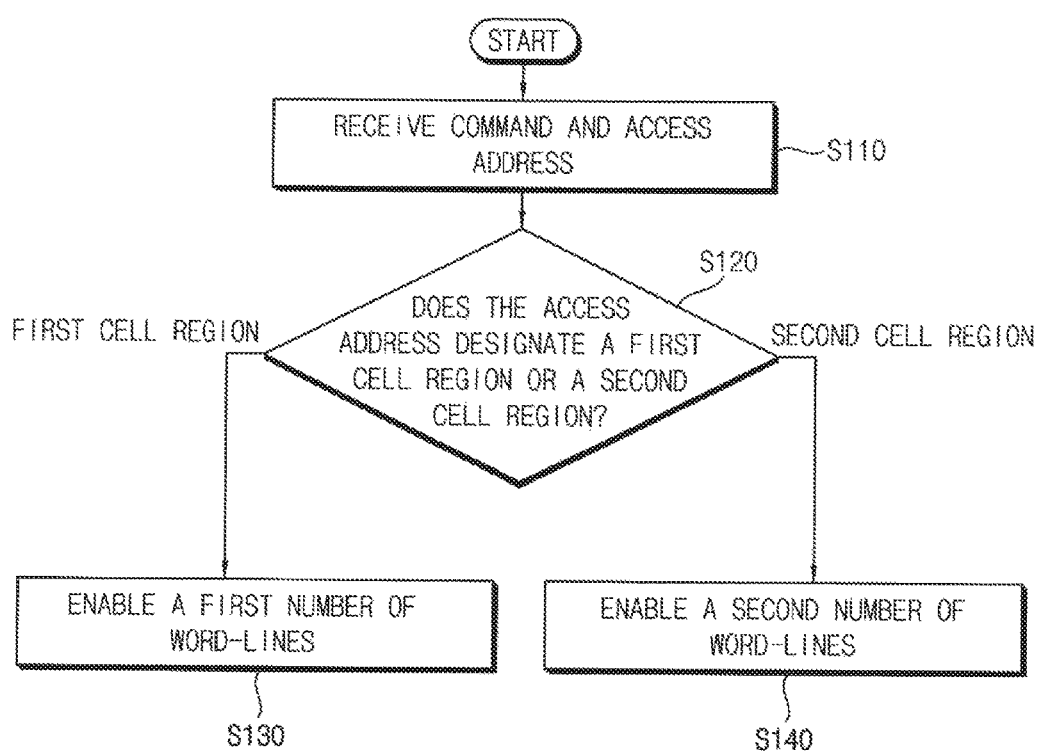
FIG. 2D is a flow chart illustrating a method of operating a semiconductor memory device according to an example embodiment.

FIG. 2D is a flow chart illustrating a method of operating a semiconductor memory device according to an example embodiment.

Referring to FIGS. 2A through 2D, in a method of operating a semiconductor memory device 201 which includes a memory cell array 301 having a first cell region and a second cell region which are identified by the fuse information FI, the access control circuit 204 may receive the command CMD and the access address ADDR (S110). The access control circuit 204 determines whether the access address ADDR accesses the first cell region or the second cell region based on the fuse information (S120). When the access address ADDR accesses the first cell region, the access control circuit 204 may perform the column repair by enabling a first number of word-lines (S130). When the access address ADDR accesses the second cell region, the access control circuit 204 may perform the column repair by enabling a second number of word-lines (S140). The second number may be greater than the first number.

Figure 3A:
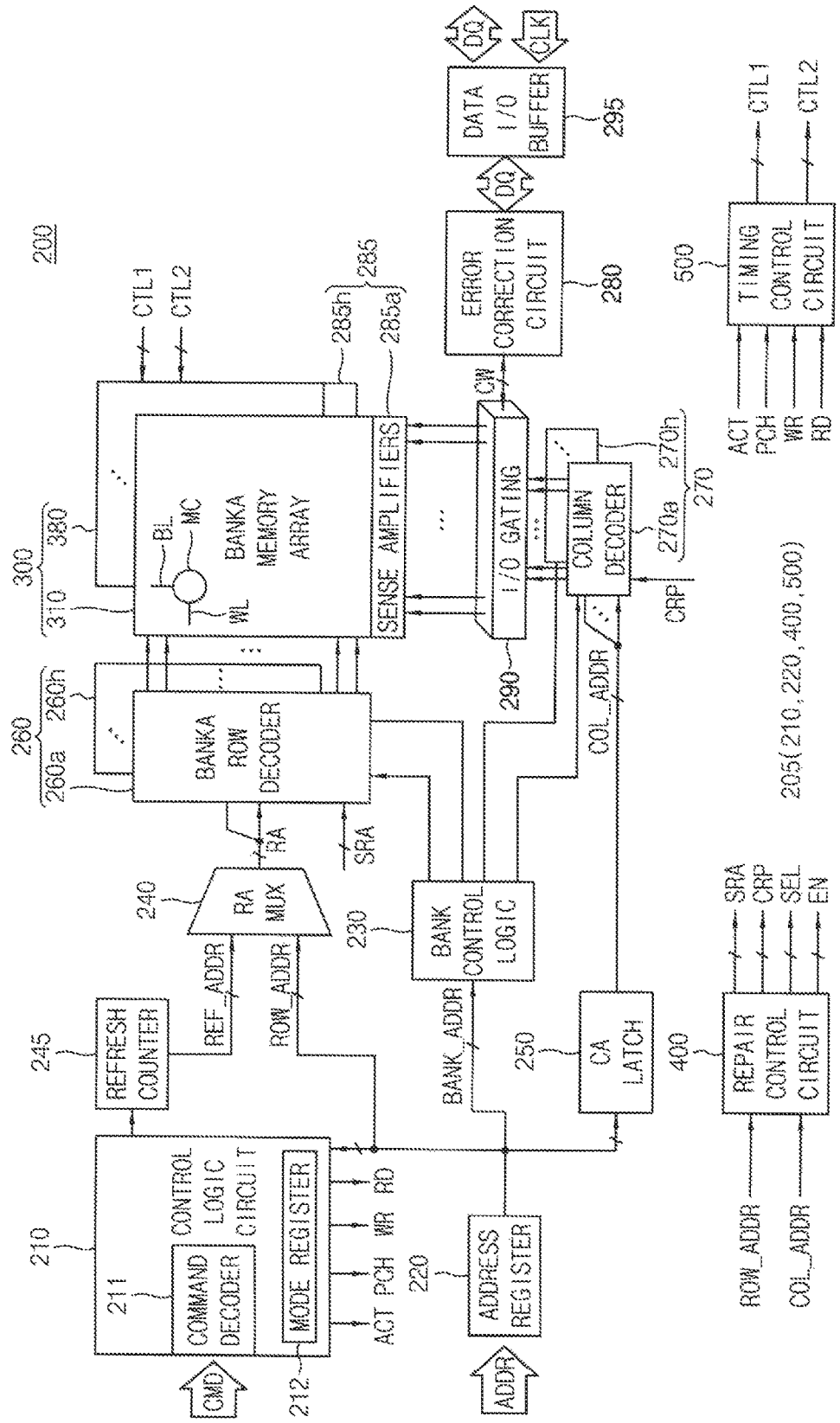
FIG. 3A is a block diagram illustrating the semiconductor memory device in FIG. 1 according to an example embodiment.

FIG. 3A is a block diagram illustrating the semiconductor memory device in FIG. 1 according to an example embodiment.

Referring to FIG. 3A, the semiconductor memory device 200 may include a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, an error correction circuit 280, a data I/O buffer 295, the repair control circuit 400 and a timing control circuit 500.

The control logic circuit 210, the address register 220, the repair control circuit 400 and the timing control circuit 500 may constitute an access control circuit 205.

The memory cell array 300 includes first through eighth bank arrays 310-380. The row decoder 260 includes first through eighth bank row decoders 260a-260h respectively coupled to the first through eighth bank arrays 310-380, the column decoder 270 includes first through eighth bank column decoders 270a-270h respectively coupled to the first through eighth bank arrays 310-380, and the sense amplifier unit 285 includes first through eighth bank sense amplifiers 285a-285h respectively coupled to the first through eighth bank arrays 310-380. The first through eighth bank arrays 310-380, the first through eighth bank row decoders 260a-260h, the first through eighth bank column decoders 270a-270h and first through eighth bank sense amplifiers 285a-285h may form first through eighth banks. Each of the first through eighth bank arrays 310-380 may include a plurality of memory cells MC formed at intersections of a plurality of word-lines WL and a plurality of bit-line BL.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, provide the received row address ROW_ADDR to the row address multiplexer 240 and provide the received column address COL_ADDR to the column address latch 250.

The bank control logic 230 may generate bank control signals in response to the bank address BANK_ADDR. One of the first through eighth bank row decoders 260a-260h corresponding to the bank address BANK_ADDR may be activated in response to the bank control signals, and one of the first through eighth bank column decoders 270a-270h corresponding to the bank address BANK_ADDR may be activated in response to the bank control signals.

The row address multiplexer 240 may receive the row address ROW_ADDR from the address register 220, and receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a-260h.

The activated one of the first through eighth bank row decoders 260a-260h, by the bank control logic 230, may decode the row address RA that is output from the row address multiplexer 240, and activate a word-line corresponding to the row address RA. For example, the activated bank row decoder may apply a word-line driving voltage to the word-line corresponding to the row address RA. In addition, the activated bank row decoder may activate a spare word-line corresponding to the spare row address SRA output from the repair control circuit 400 simultaneously with activating the word-line corresponding to the row address RA The column address latch 250 may receive the column address COL_ADDR from the address register 220, and temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a-270h.

The activated one of the first through eighth bank column decoders 270a-270h may activate a sense amplifier corresponding to the bank address BANK_ADDR and the column address COL_ADDR through the I/O gating circuit 290. The I/O gating circuit 290 may include a circuitry for gating input/output data, and further include read data latches for storing data that is output from the first through eighth bank arrays 310-380, and write drivers for writing data to the first through eighth bank arrays 310-380.

Codeword CW read from one bank array of the first through eighth bank arrays 310-380 may be sensed by a sense amplifier coupled to the one bank array from which the data is to be read, and be stored in the read data latches. The codeword CW stored in the read data latches may be provided to the memory controller 100 via the data I/O buffer 295 after ECC decoding is performed on the codeword CW by the error correction circuit 280. The data DQ to be written in one bank array of the first through eighth bank arrays 310-380 may be provided to the data I/O buffer 295 from the memory controller 100 and be written in one bank array by the write drivers after an ECC encoding is performed on the data DQ by the error correction circuit 280.

The data I/O buffer 295 may provide the data DQ from the memory controller 100 to the error correction circuit 280 in a write operation of the semiconductor memory device 200, based on the clock signal CLK and may provide the data DQ from the error correction circuit 280 to the memory controller 100 in a read operation of the semiconductor memory device 200.

The error correction circuit 280, in the write operation, may generate parity bits based on the data DQ from the data I/O buffer 295, and may provide the I/O gating circuit 290 with the codeword CW including the data DQ and the parity bits. The I/O gating circuit 290 may write the codeword CW in one bank array.

In addition, the error correction circuit 280, in the read operation, may receive the codeword CW, read from one bank array, from the I/O gating circuit 290. The error correction circuit 280 may perform an ECC decoding on the data DQ based on the parity bits in the codeword CW, correct a single bit error or double bit error in the data DQ and provide corrected data to the data I/O buffer 295.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes a command CMD received from the memory controller 100 and a mode register 212 that sets an operation mode of the semiconductor memory device 200.

For example, the command decoder 211 may generate operation control signals ACT, PCH, WE and RD corresponding to the command CMD by decoding a write enable signal, a row address strobe signal, a column address strobe signal, a chip select signal, etc. The control logic circuit 210 may provide the operation control signals ACT, PCH, WE and RD to the timing control circuit 500. The operation control signals ACT, PCH, WE and RD may include an active signal ACT, a precharge signal PCH, a write signal WE and a read signal RD.

The timing control circuit 400 may generate first control signals CTL1 to control voltage level of the word-line WL and second control signals CTL2 to control voltage level of the bit-line BT in response to the operation control signals ACT, PCH, WE and RD, and provide the first control signals CTL1 and the second control signals CTL2 to the memory cell array 300.

The repair control circuit 400 may generate repair control signals CRP, SEL, EN and SRA to control repair operation of the first cell region and the second cell region of the bank arrays based on the row address ROW_ADDR of the address (or the access address ADDR), the column address and the fuse information of the word-lines. The repair control circuit 400 may provide the spare row address SRA to the corresponding bank row decoder, provide the column repair signal CRP to the corresponding bank column decoder and provide a selection signal SEL and an enable signal EN to a block control circuit associated with a corresponding sub-array block.

That is, the access control circuit 205 may access the first cell region and the second cell region differently based on the command CMD, the access address ADDR and the fuse information of the first cell region and the second cell region.

Figure 3B:
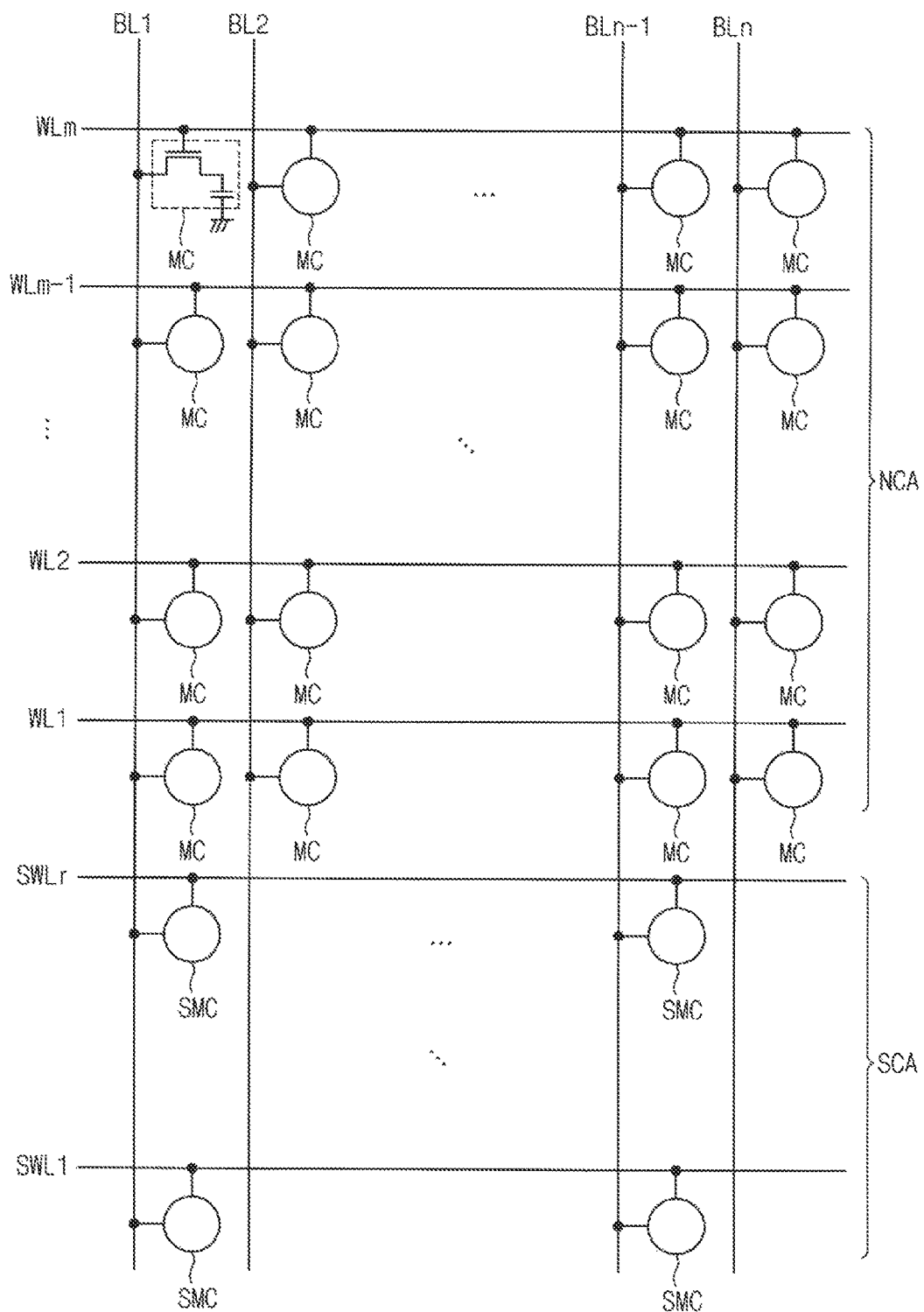
FIG. 3B illustrates an example of the first bank array in the semiconductor memory device of FIG. 3A.

FIG. 3B illustrates an example of the first bank array in the semiconductor memory device of FIG. 3A.

Referring to FIG. 3B, the first bank array 310 may include a normal cell array NCA and a spare cell array SCA. The normal cell array NCA may include a plurality of word-lines WL1-WLm (where m is a natural number greater than two), a plurality of bit-lines BL1-BLn (where n is a natural number greater than two), and a plurality of memory cells MCs disposed at intersections between the word-lines WL1-WLm and the bit-lines BL1-BLn. The spare cell array SCA may include a plurality of pare word-lines SWL1-SWLr (where r is a natural number greater than two), the bit-lines BL1-BLn, and a plurality of spare memory cells SMCs disposed at intersections between the spare word-lines SWL1-SWLr and the bit-lines BL1-BLn.

The normal cell array NCA may be divided into the first cell region and the second cell region based on the fuse information of each of the word-lines WL1-WLm. The fuse information of word-lines in the first cell region may have a second logic level (a logic low level). The fuse information of word-lines in the second cell region may have a first logic level (a logic high level). The spare memory cells SMCs in the spare cell array SCA may be used for the column repair operation.

In exemplary embodiments, other bank arrays 320-380 may only include the first cell region, or only include the first cell region and the second cell region and may not include the spare cell array SCA.

Figure 4:
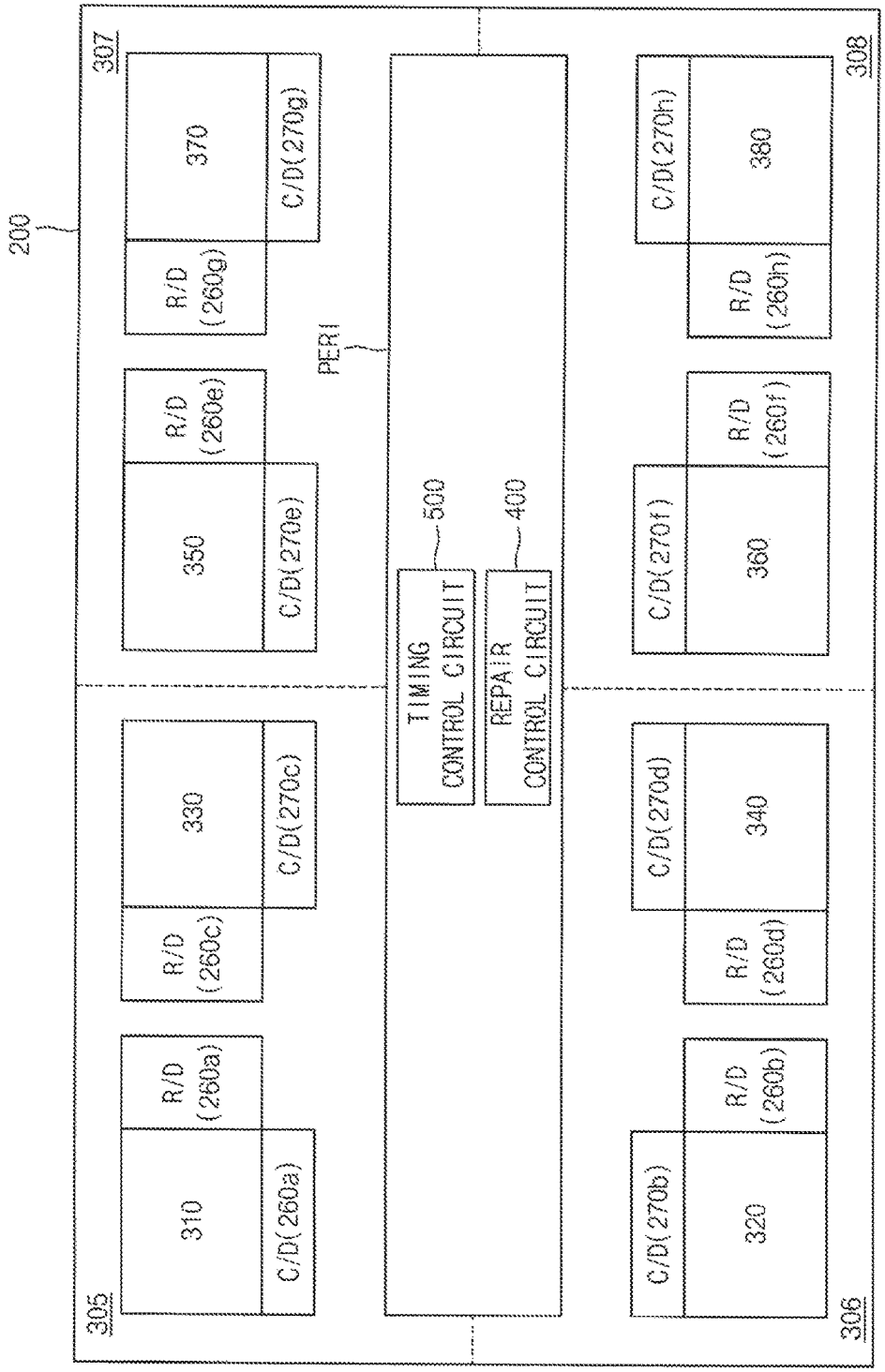
FIG. 4 illustrates an arrangement of the semiconductor memory device of FIG. 3A according to an example embodiment.

FIG. 4 illustrates an arrangement of the semiconductor memory device of FIG. 3A according to an example embodiment.

Referring to FIG. 4, the semiconductor memory device 200 may include the first through eighth bank arrays 310-380, the first through eighth bank row decoders 260a-260h, the first through eighth bank column decoders 270a-270h, the timing control circuit 500 and the repair control circuit 400. According to an example embodiment, the first through eighth bank arrays may be distributed in a core region of the substrate.

The first bank array 310 and the third bank array 330 may be arranged in a first region 305 of a substrate, the second bank array 320 and the fourth bank array 340 may be arranged in a second region 306 of the substrate, the fifth bank array 350 and the seventh bank array 370 may be arranged in a third region 307 of the substrate, and the sixth bank array 360 and the eighth bank array 380 may be arranged in a fourth region 308 of the substrate. A person of ordinary skill in the art should understand and appreciate that arrangements illustrated in FIG. 4 are provided for illustrative purposes and the present disclosure is not limited to the structure as shown.

The first bank row decoder (or first row decoder) 260a and the first bank column decoder (or first column decoder) 270a may be disposed adjacent to the first bank array 310, the second bank row decoder 260b and the second bank column decoder 270b may be disposed adjacent to the second bank array 320, the third bank row decoder 260c and the third bank column decoder 270c may be disposed adjacent to the third bank array 330, and the eighth bank row decoder 260h and the eighth bank column decoder 270h may be disposed adjacent to the eighth bank array 380. The first through fourth regions 305-308 may correspond to a core region of the substrate.

Figure 5:
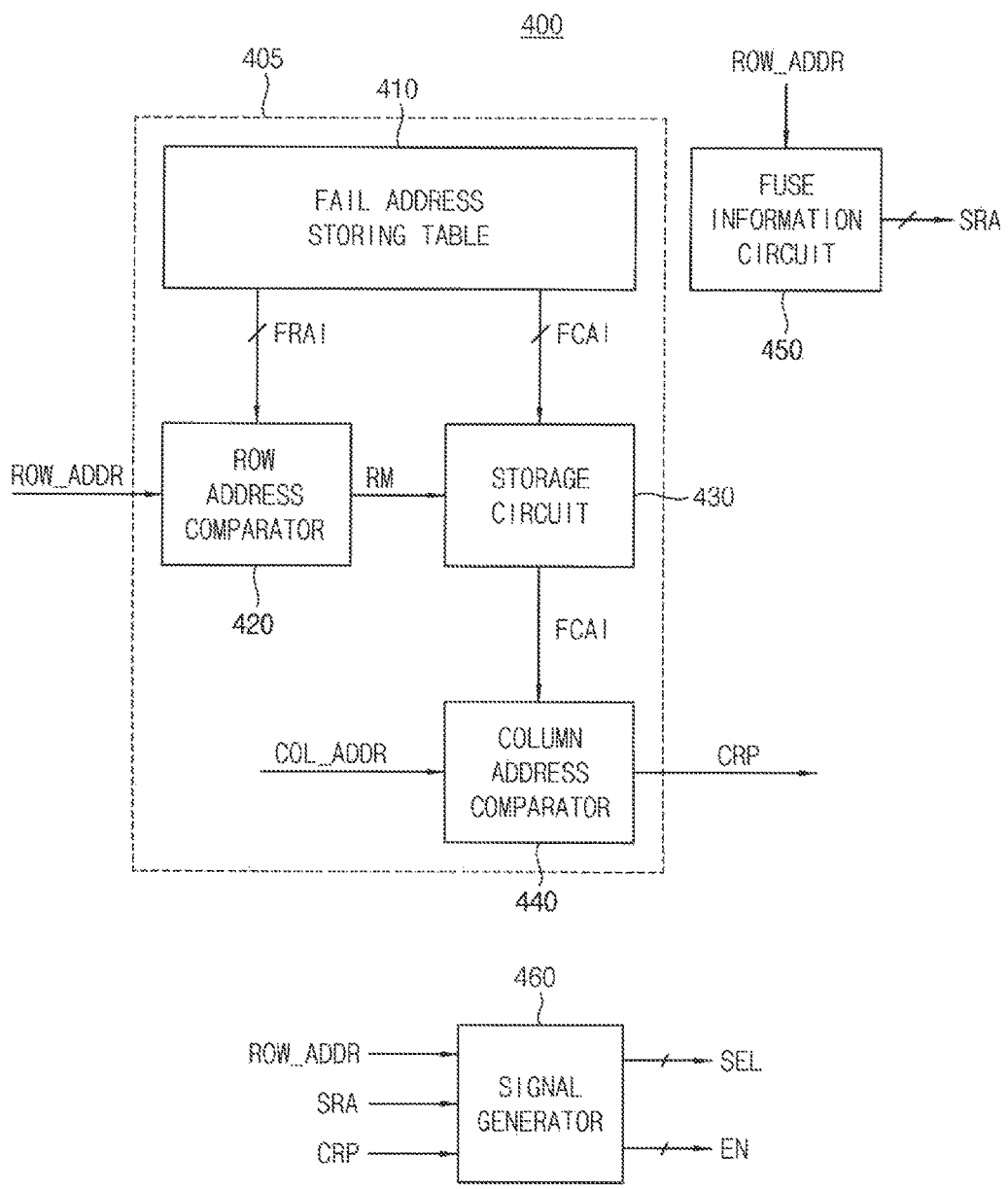
FIG. 5 is a block diagram illustrating the repair control circuit in the semiconductor memory device 200 of FIG. 3A according to an example embodiment.

FIG. 5 is a block diagram illustrating the repair control circuit in the semiconductor memory device 200 of FIG. 3A according to an example embodiment.

Referring to FIG. 5, the repair control circuit 400 may include an address comparison circuit 405, a fuse information circuit 450 and a signal generator 460.

The address comparison circuit 405 may compare address information of at least one defective cell occurring in the memory cell array 300 with the row address ROW_ADDR and the column address COL_ADDR and output the column repair signal CRP to repair the at least one defective cell based on the comparison.

The address comparing circuit 405 may include a fail address storing table 410, a row address comparator 420, a storage circuit 430 and a column address comparator 440.

The fail address storing table 410 may store row address information FRAI and column address information FCAI of at least one defective cell occurring in the normal cell area NCA of the memory cell array 300. The fail address storing table 410 may include non-volatile memory devices to store the location information of the at least one defective cell. For example, the fail address storing table 410 may include anti-fuses to store the location information of the at least one defective cell. The location information of the at least one defective cell stored in the fail address storing table 410 may be updated.

For example, location information of defective cells that occur in the normal cell area NCA, caused when the semiconductor memory device 200 is continuously used, may be updated in the fail address storing table 410. In addition, location information of additional defective cells occurring after the semiconductor memory device 200 is packaged may be updated in the fail address storing table 410. Such location information of defective cells may be obtained by testing whether a fail bit occurs in the semiconductor memory device 200. The test may be performed before the semiconductor memory device 200 is packaged, i.e., at a wafer level, or may be performed after the semiconductor memory device 200 is packaged. A post-package repair (PPR) may be performed using the repair control circuit 400.

The location information of the at least one defective cell may be the row address information FRAI and the column address information FCAI of the at least one defective cell.

The row address comparator 420 may store the row address information FRAI received from the fail address storing table 410. The row address comparator 420 may receive the row address information FRAI from the fail address storing table 410 simultaneously when the semiconductor memory device 200 is driven or a desired time period after the semiconductor memory device 200 is driven. The row address comparator 420 may receive the row address ROW_ADDR of the access address ADDR, compare the row address ROW_ADDR with the row address information FRAI, and output a row match signal RM when the row address ROW_ADDR matches the row address information FRAI.

The storage circuit 430 may store the column address information FCAI and output column address information FCAI of the defective cell that matches the row address ROW_ADDR of the access address ADDR, according to the row match signal RM. The column address comparator 440 may compare the column address COL_ADDR of the access address ADDR with the column address information FCAI of the defective cell and then output the column repair signal CRP to repair the defective cell when the column address COL_ADDR matches the column address information FCAI.

The fuse information circuit 450 may store the row address ROW_ADDR, the fuse information of each of the row address ROW_ADDR, and spare row address SRA corresponding to the row address ROW_ADDR and selectively output the spare row address SRA according to the fuse information.

The signal generator 460 may generate the selection signal SEL to select a corresponding sub-array block and the enable signal EN to selectively enable the corresponding sub-array block based on the row address (or access row address) ROW_ADDR, the spare row address SRA and the column repair signal CRP.

Figure 6:
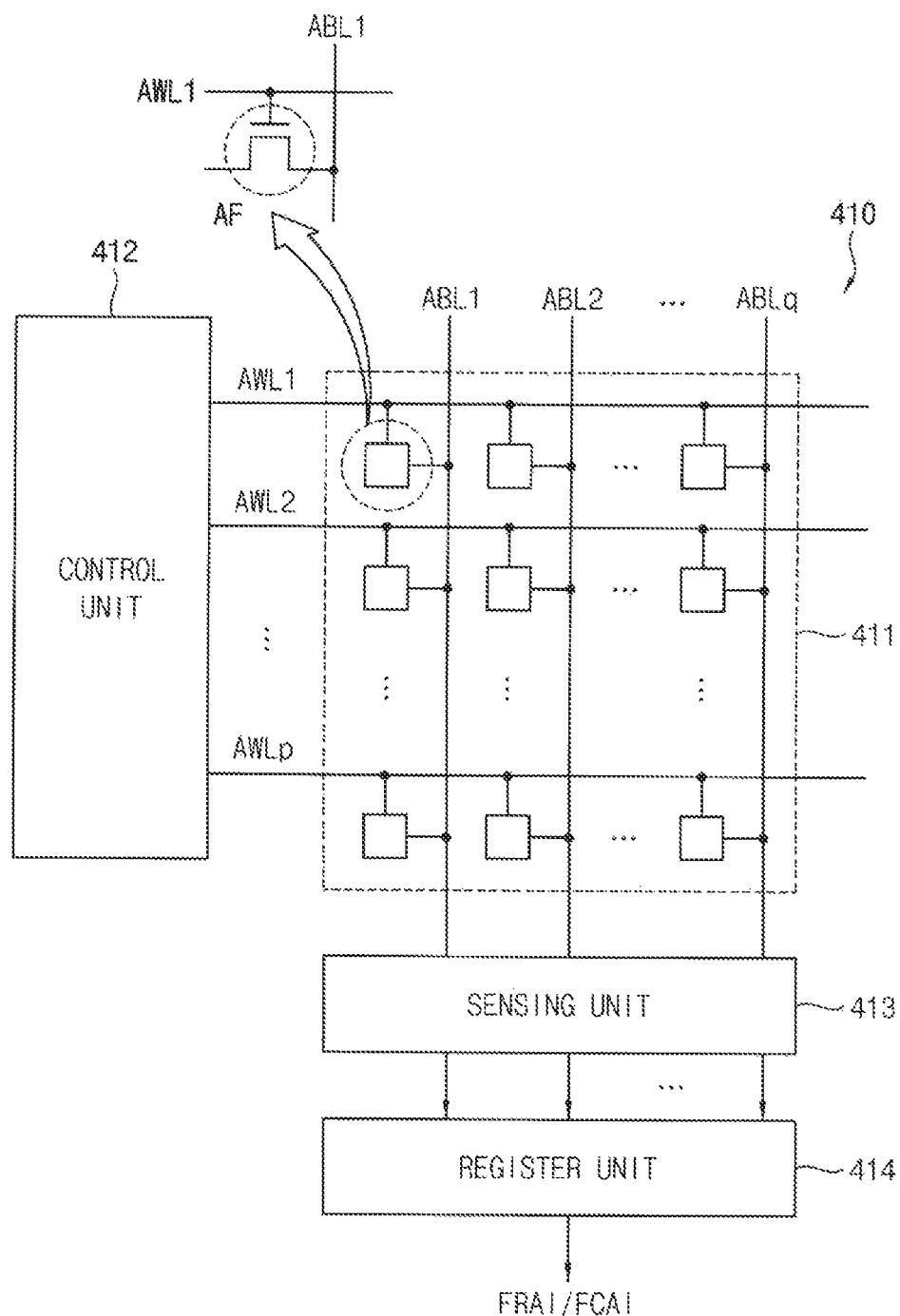
FIG. 6 illustrates an example of the fail address storing table in the repair control circuit of FIG. 5.

FIG. 6 illustrates an example of the fail address storing table in the repair control circuit of FIG. 5.

Referring to FIG. 6, the fail address storing table 410 may include anti-fuse array 411, a control unit 412, a sensing unit 413 and a register unit 414.

The anti-fuse array 411 may include pxq anti-fuses (AFs) which are respectively connected to intersections of p rows and q columns, where p and q are natural numbers. The anti-fuse array 411 may include p word-lines AWL1 to AWLp for accessing anti-fuses (AFs) disposed at the p rows, and q bit-lines ABL1 to ABLq disposed to correspond to q columns so as to deliver information read from the anti-fuses (AFs).

The control unit 412 may program the location information of defective cells in the anti-fuse array 411 or read the location information of defective cells from the anti-fuse array 412. The sensing unit 413 may sense and amplify the location information of defective cells received from the anti-fuse array 411 and output a result of the amplifying. The register unit 414 may temporarily store the location information of defective cells received from the sensing unit 413. The register unit 414 may output the row address information FRAI and column address information FCAI of the defective cells, to the row address comparator 420 and the storage circuit 430, respectively.

Figure 7:
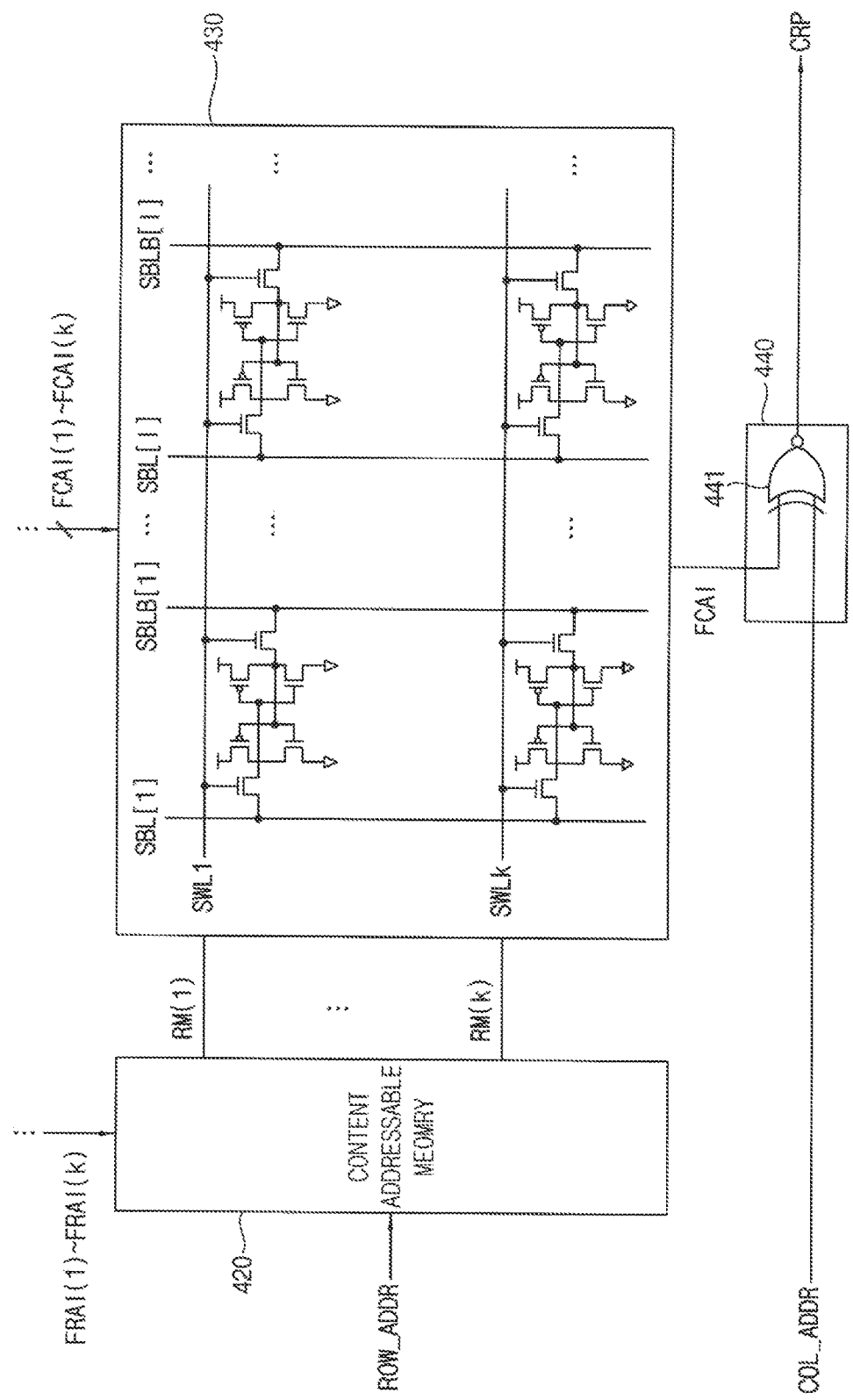
FIG. 7 illustrates the row address comparator, the storage circuit and the column address comparator in the repair control circuit of FIG. 5.

FIG. 7 illustrates the row address comparator, the storage circuit and the column address comparator in the repair control circuit of FIG. 5.

Referring to FIG. 7, the row address comparator 420 may be a content addressable memory (CAM). The row address comparator 420 may store row address information FRAI(1) to FRAI(k) of the defective cells in a memory space thereof. The row address comparator 420 may compare the row address ROW_ADDR with the row address information FRAI(1) to FRAI(k) of the defective cells so as to determine whether there is a defective cell, the row address information of which is the same as the row address ROW_ADDR. Here, k is a natural number greater than one.

When there is a defective cell, the row address information of which is the same as the row address ROW_ADDR, then the row address comparator 420 may output a row match signal RM corresponding to the row address ROW_ADDR. For example, when a number of rows at which defective cells occur is k, row match signals RM(1) to RM(k) corresponding to the k rows may be output. The row match signals RM(1) to RM(k) respectively enable word-lines SWL1 to SWLk for storing column address information FCAI(1) to FCAI(k) of the defective cells in the storage circuit 430, which will be described in detail below.

The storage circuit 430 may be a static random access memory (SRAM). The storage circuit 430 may have an array of SRAM cells connected to intersections of the k word-lines SWL1 to SWLk, l bit-lines SBL1 to SBL1, and l complementary bit-lines SBLB1 to SBLB1. Here, 'l' denotes a natural number greater than one. The storage circuit 430 may enable word-lines SWL1 to SWLk corresponding to the row match signals RM(1) to RM(k), according to the row match signals RM(1) to RM(k), and the row address comparator 420 thus output column address information FCAI of a defective cell matching the row address ROW_ADDR to the column address comparator 440.

The column address comparator 440 may be implemented with an XOR gate. The column address comparator 440 may compare the column address COL_ADDR of the access address ADDR with the column address information FCAI of the defective cell received from the storage unit 122, and output the column repair signal CRP for repairing the defective cell to a corresponding column decoder when the column address COL_ADDR matches the column address information FCAI. The column repair signal CRP may be set in such a manner that the corresponding column decoder may disable the column address COL_ADDR of the access cell and enable a redundancy column address.

Figure 8:
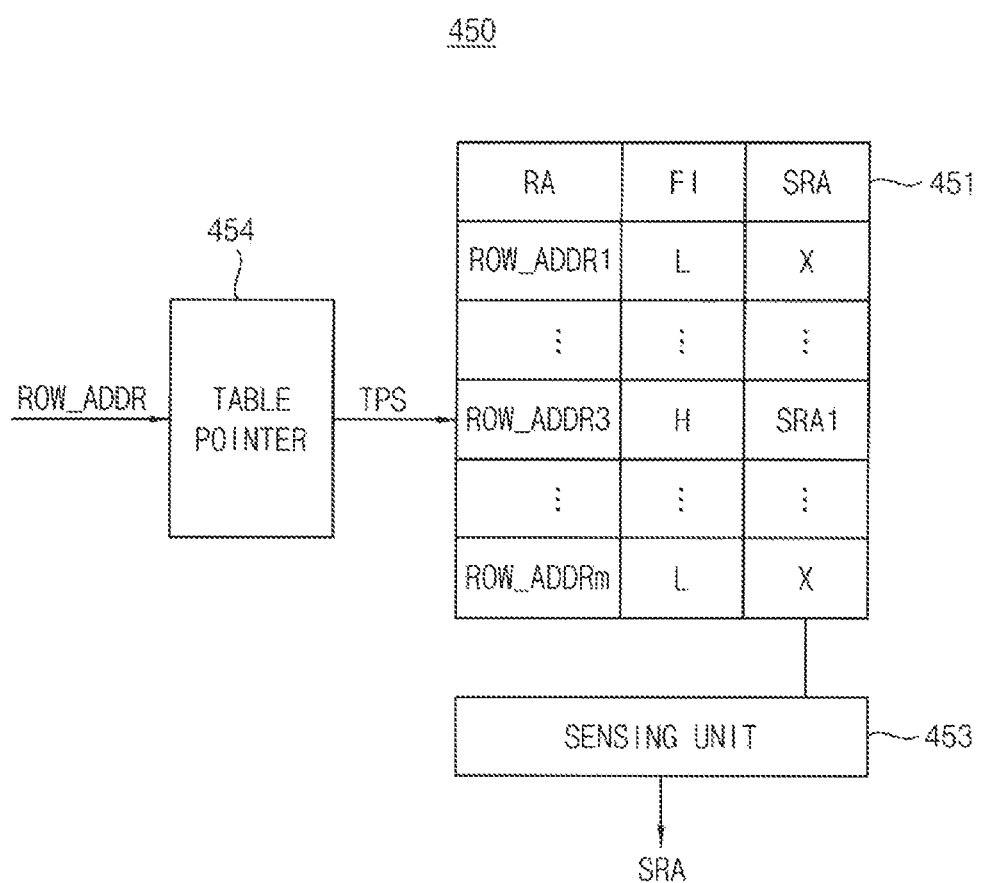
FIG. 8 illustrates the fuse information circuit in the repair control circuit of FIG. 5.

FIG. 8 illustrates the fuse information circuit in the repair control circuit of FIG. 5.

Referring to FIG. 8, the fuse information circuit 450 may include a table pointer 454, a storing table 451 and a sensing unit 453.

The storing table 451 may store the row address ROW_ADDR of each word-line, the fuse information FI of each word-line and the spare row address SRA corresponding to the row address ROW_ADDR when the fuse information FI has a first logic level. The table pointer 454 may output a table pointing signal TPS which designates the row address ROW_ADDR, and the storing table 450 may output the spare row address SRA corresponding to the row address ROW_ADDR to the sensing unit 453 when the fuse information FI of the row address ROW_ADDR designated by the table point signal TPS has a first logic level. The sensing unit 453 may output the spare row address SRA to a corresponding row decoder.

In FIG. 8, the fuse information FI of a row address ROW_ADDR3 of the row addresses ROW_ADDR1-ROW_ADDRm may have a first logic level (indicated by "H"), and a spare row address SRA1 corresponding to the row address ROW_ADDR3 may be output to the corresponding row decoder. Therefore, column repair operation may be performed by simultaneously activating a word-line corresponding to the row address ROW_ADDR3 and a spare word-line corresponding to the spare row address SRA1.

Figure 9:
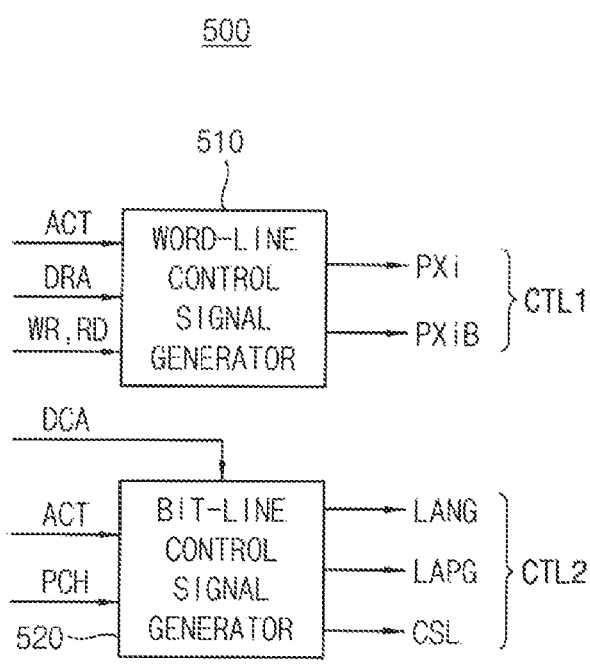
FIG. 9 is a block diagram illustrating an example of the timing control circuit in the semiconductor memory device of FIG. 3A according to an example embodiment.

FIG. 9 is a block diagram illustrating an example of the timing control circuit in the semiconductor memory device of FIG. 3A according to an example embodiment.

Referring to FIG. 9, the timing control circuit 500 may include a word-line control signal generator 510 and a bit-line control signal generator 520.

The word-line control signal generator 510 may generate a first control signal CTL1 including first and second word-line control signals PXi and PXiB to control a word-line based on the operation control signals ACT, WR and RD corresponding to the command CMD a decoded row address DRA. In addition, the word-line control signal generator 510 may provide the first and second word-line control signals PXi and PXiB to a sub word-line driver.

The bit-line control signal generator 520 may generate second control signals CTL2 including signals LANG, LAPG, and CSL to control voltage levels of a bit-line pair of a selected memory cell, in response to the operation control signals ACT and PCH and the decoded column address DCA and may provide the second control signals LANG, LAPG, and CSL to a bit-line sense amplifier.

Figure 10:
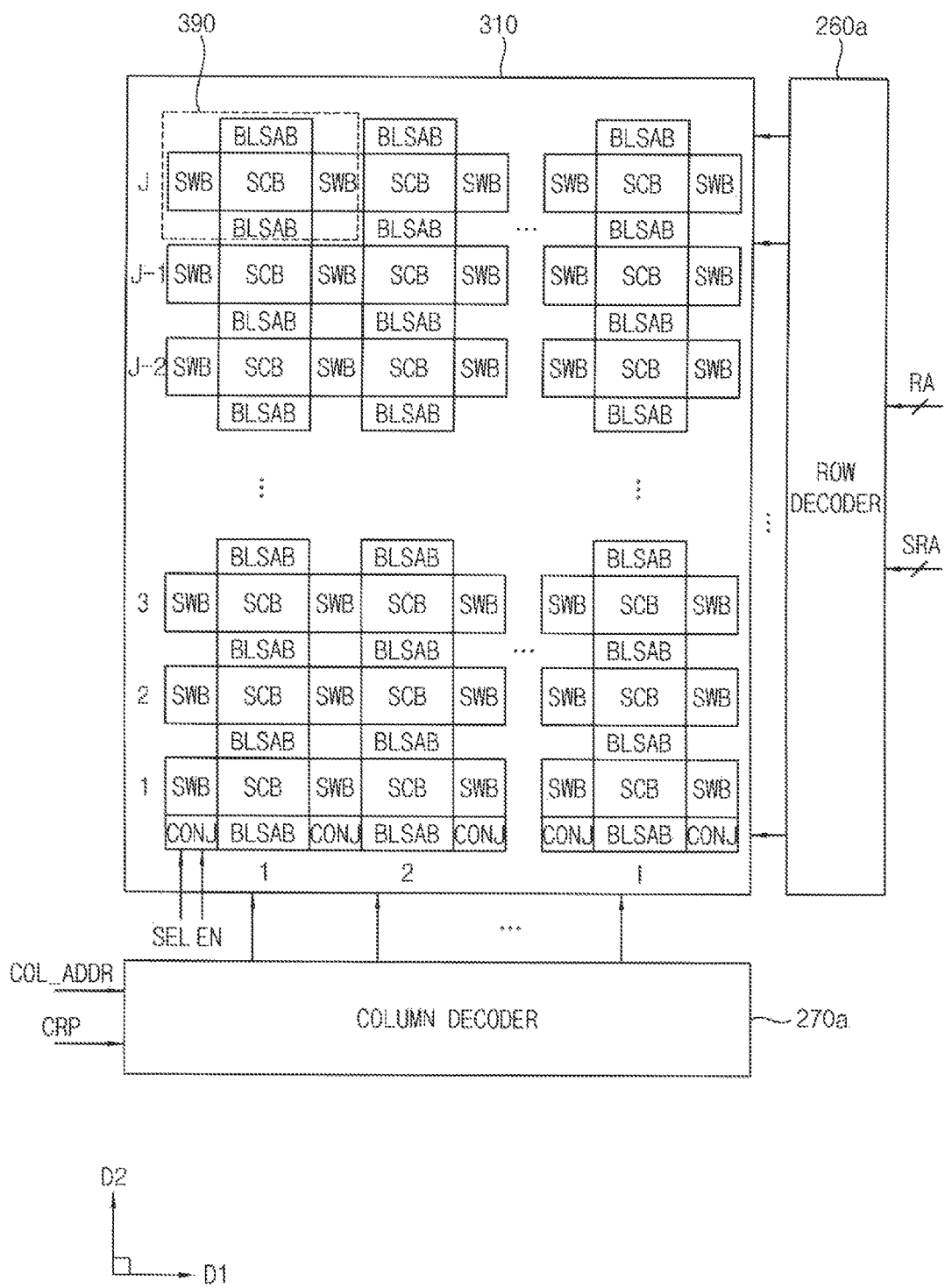
FIG. 10 is an exemplary illustration of architecture of one bank array in the semiconductor memory device of FIG. 3A.

FIG. 10 is an example illustration of architecture of one bank array in the semiconductor memory device of FIG. 3A.

In FIG. 10, there are shown the first bank array 310 and circuits associated with the first bank array 310. Arrangement of circuits and a corresponding bank array may be similar in other bank arrays 320-380. In FIG. 10, there are illustrated the first bank array 310, the first column decoder 270a and the first row decoder 260a.

Referring to FIG. 10, in the first bank array 310, I sub-array blocks SCB may be disposed in a first direction D1, and J sub-array blocks SCB may be disposed in a second direction D2 substantially perpendicular to the first direction D1. A plurality of bit-lines, a plurality of word-lines and a plurality of memory cells may be disposed in each of the sub-array blocks SCB.

In addition, the plurality of memory cells may be disposed at intersections between the bit-lines and the word-lines, such as shown, for example, in FIG. 3B. I+1 sub word-line driver regions SWB may be disposed between the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2. Bit-line sense amplifiers to sense data stored in the memory cells may be disposed in the bit-line sense amplifier regions BLSAB.

A plurality of conjunction regions CONJ may be disposed adjacent to the sub word-line driver regions SWB and the bit-line sense amplifier regions BLSAB. A block control circuit may be disposed in each of the conjunction regions CONJ. The block control circuit may receive the selection signal SEL and the enable signal EN. The first column decoder 270a may receive the column address (or access column address COL_ADDR) and the column repair signal CRP. The first row decoder 260a may receive the access row address RA and the spare row address SRA.

Figure 11:
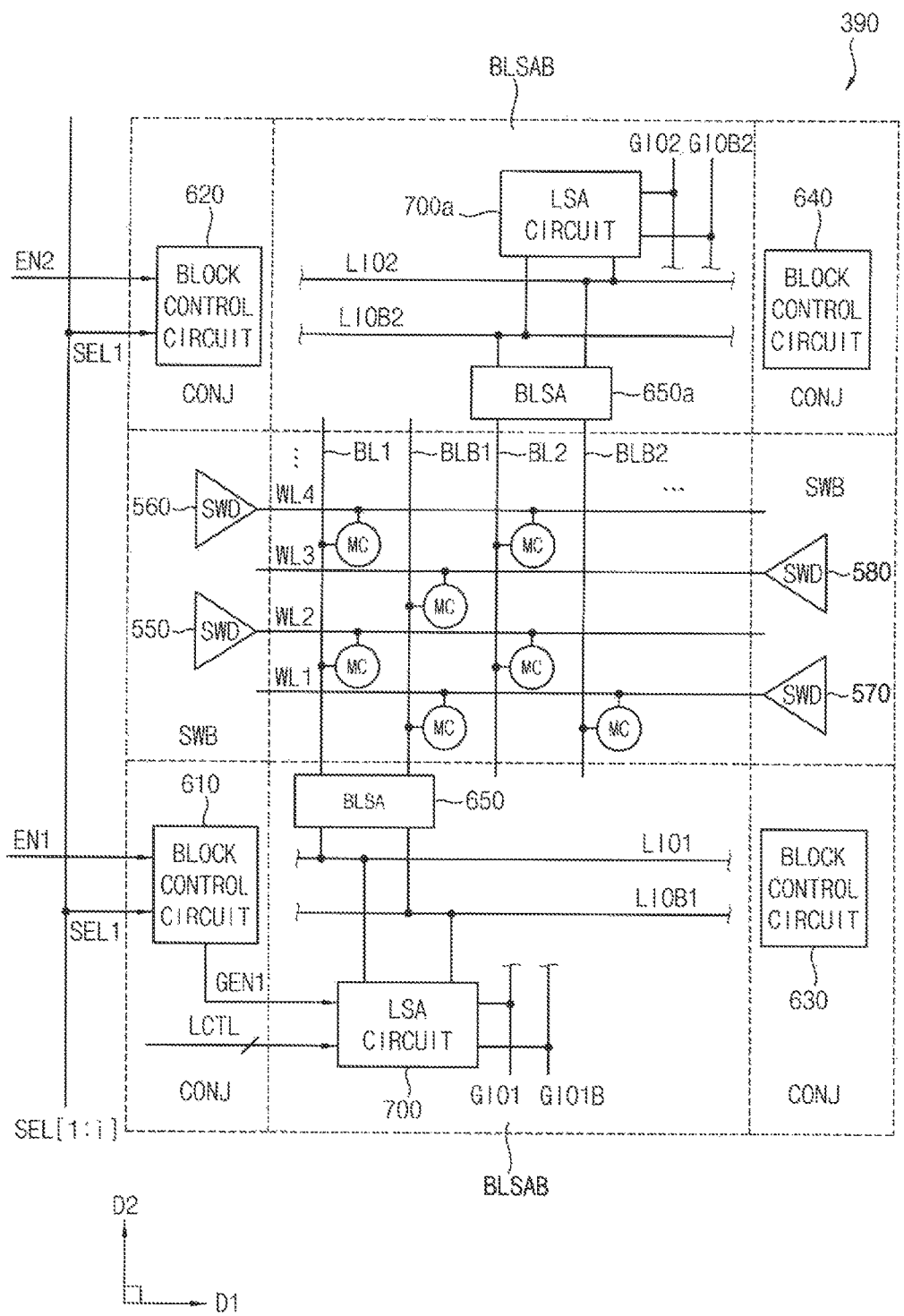
FIG. 11 illustrates a portion of the first bank array in FIG. 10 according to an example embodiment.

FIG. 11 illustrates a portion of the first bank array in FIG. 10 according to an example embodiment.

Referring to FIGS. 10 and 11, in a portion 390 (FIG. 10) of the first bank array 310, the sub-array block SCB, the bit-line sense amplifier regions BLSAB, the sub word-line driver regions SWB and the conjunction regions CONJ may be disposed.

The sub-array block SCB may include a plurality of word-lines WL1-WL4 extending in a row direction (the first direction D1) and a plurality of bit-line pairs BL1-BL2 and BLB1-BLB2 extending in a column direction (the second direction D2). The sub-array block SCB may include a plurality of memory cells MCs disposed at intersections between the word-lines WL1-WL4 and the bit-line pairs BL1-BL2 and BLB1-BLB2.

With continued reference to FIG. 10, the sub word-line driver regions SWB may include a plurality of sub word-line drivers 550, 560, 570 and 580 that respectively drive the word-lines WL1-WL4. The sub word-line drivers 550 and 560 may be disposed in the sub word-line driver region SWB, which is leftward (in this example), with respect to the sub-array block SCB. In addition, the sub word-line drivers 570 and 580 may be disposed in the sub word-line driver region SWB, which is rightward (in this example), with respect to the sub-array block SCB.

The bit-line sense amplifier regions BLSAB may include bit-line sense amplifiers BLSA 650 and 650a coupled to the bit-line pairs BL1-BL2 and BLB1-BLB2 and local sense amplifier circuits 700 and 700a. The bit-line sense amplifier 650 may sense and amplify a voltage difference between the bit-line pair BL and BLB to provide the amplified voltage difference to a local I/O line pair LIO1 and LIOB1.

The local sense amplifier circuit 700 may control connection between the local I/O line pair LIO1 and LIOB1 and a global I/O line pair GIO1 and GIOB1 in response to a gated enable signal GEN1 and a local control signal LCTL, and the local sense amplifier circuit 700a may control connection between the local I/O line pair LIO2 and LIOB2 and a global I/O line pair GIO2 and GIOB2 in response to a corresponding gated enable signal and a corresponding local control signal.

As illustrated in FIG. 11, the bit-line sense amplifiers 650 and 650a may be alternately disposed at upper portion and a lower portion of the sub-array block SCB. The conjunction regions CONJ may be disposed adjacent to the bit-line sense amplifier regions BLSAB, the sub word-line driver regions SWB and the sub-array block SCB. A plurality of block control circuits 610, 620, 630 and 640 may be disposed in the conjunction regions CONJ.

The block control circuit 610 may provide a gated enable signal GEN1 to the local sense amplifier circuit 700 in response to an enable signal EN1 and a selection signal SEL1, and the local sense amplifier circuit 700 may selectively provide or cut off a connection to the global I/O line pair GIO1 and GIOB1 in response to the gated enable signal GEN.

In FIG. 11, the portion 390 of the first bank array 310 having structure of folded bit-line is illustrated, the description with reference to FIG. 11 may be identically applied to a bank array having an open bit-line structure.

In FIG. 11, there is description on the sub-array block SCA in the normal cell array NCA in the first bank array in FIG. 3B, a sub-array block in the spare cell array SCA in the first bank array in FIG. 3B may have a substantially same configuration as the sub-array block SCA of FIG. 11. Therefore, when at least one defective cell in the second cell region is to be repaired, a local sense amplifier circuit in a sub-array block including the defective cell, in the normal cell array NCA may be disabled and a local sense amplifier circuit in a sub-array block including a memory cell to replace the defective cell may be enabled.

Figure 12:
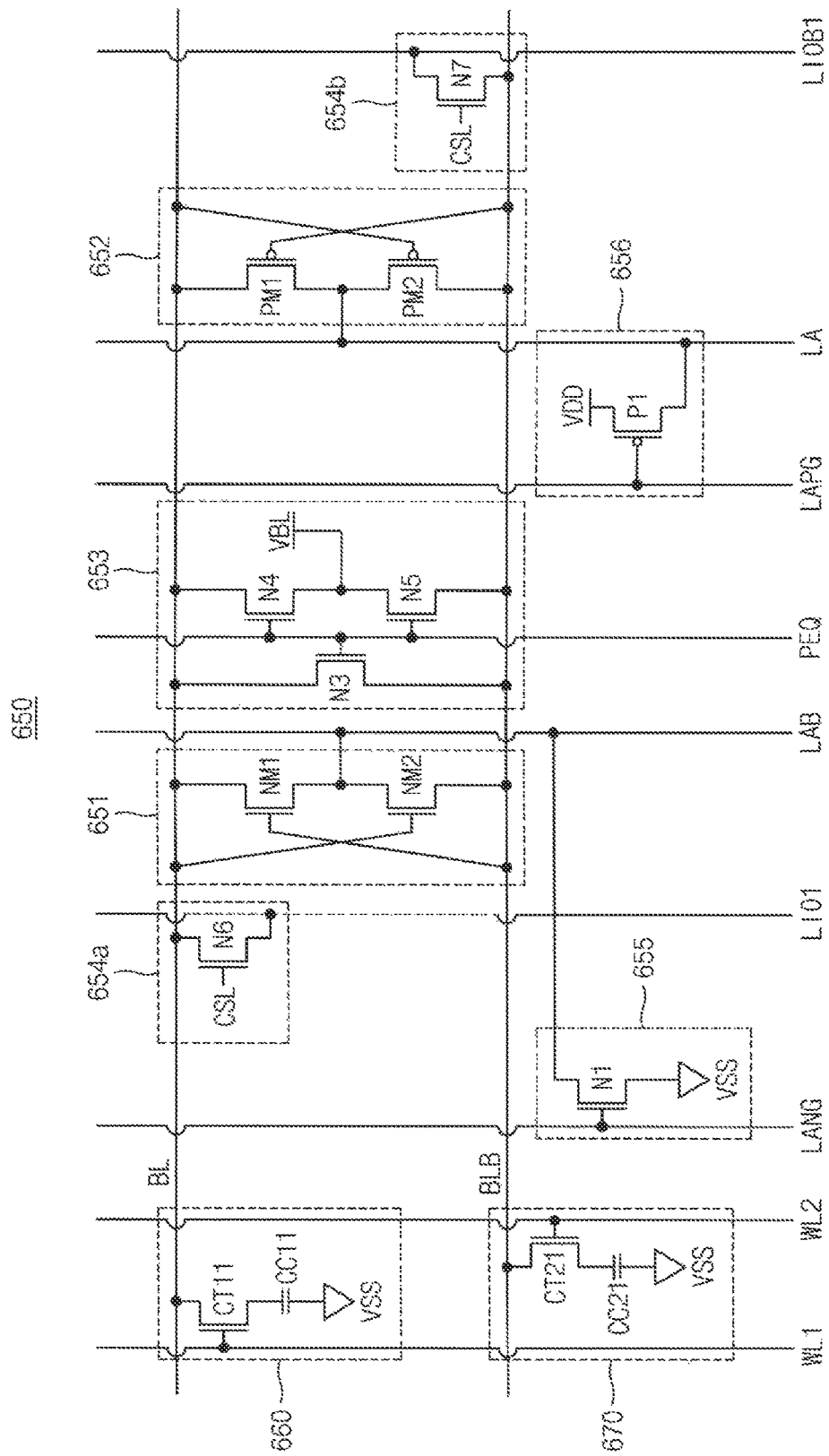
FIG. 12 is a circuit diagram illustrating the bit-line sense amplifier in FIG. 11 according to an example embodiment.

FIG. 12 is a circuit diagram illustrating the bit-line sense amplifier in FIG. 11 according to an example embodiment.

Referring to FIG. 12, the bit-line sense amplifier 650 may be coupled to bit-lines BL and BLB of each of memory cells 660 and 670 in the memory cell array 300. The bit-line sense amplifier 650 shown in FIG. 12 may include an N-type sense amplifier (NSA) 651, a P-type sense amplifier (PSA) 652, a pre-charge circuit 653, column select switches 654a and 654b, an NSA driver 655 and a PSA driver 656.

The N-type sense amplifier 651 may discharge a low-level bit-line of the bit-lines (or bit-line pair) BL and BLB to a low level during a sensing operation. The N-type sense amplifier 651 may include two n-channel metal oxide semiconductor (NMOS) transistors NM1 and NM2. A gate of the NMOS transistor NM1 may be connected to the bit-line (second bit-line) BLB, and a drain of the NMOS transistor NM1 may be connected to the bit-line (first bit-line) BL, and a source of the NMOS transistor NM1 may be connected to a sense enable line LAB. The NMOS transistor NM2 may have a gate connected to the bit-line BL, a drain connected to the sense enable line LAB, and a source connected to the bit-line BLB. The N-type sense amplifier 651 may connect a low-level bit-line to the sense enable line LAB. The sense enable line LAB may be connected to the ground voltage VSS. The low-level bit line may be one of the bit lines BL and BLB according to data stored in a selected memory cell 660 or 670.

The P-type sense amplifier 652 may charge a high-voltage bit-line of the bit-lines BL and BLB with a power supply voltage VDD level at a sensing operation. The P-type sense amplifier 652 may include two p-channel metal oxide semiconductor (PMOS) transistors PM1 and PM2. The PMOS transistor PM1 may have a gate connected to the bit-line BLB, a source connected to the bit-line BL, and a drain connected to a sense enable line LA. The PMOS transistor PM2 may have a gate connected to the bit-line BL, a source connected to sense enable line LA, and a drain connected to the bit-line BLB.

The P-type sense amplifier 652 may charge a high-voltage bit-line of the bit-lines BL and BLB with a power supply voltage VDD provided to the sense enable line LA.

The PSA driver 656 may provide a charging voltage VDD to the sense enable line LA. Therefore, the transistor PM2 may be turned off because the gate of the transistor PM2 is coupled to the bit-line with a voltage increased by the charge sharing.

The pre-charge circuit 653 may pre-charge the bit-lines BL and BLB with a half voltage VDD/2 in response to a control signal PEQ in sensing operation. When the control signal PEQ is activated, the pre-charge circuit 653 may supply a bit-line pre-charge voltage VBL to the bit-lines BL and BLB. The bit-line pre-charge voltage VBL may be a half voltage VDD/2. The bit-lines BL and BLB may be connected such that their voltages are equalized. If the bit-lines BL and BLB are charged by the pre-charge level VBL, the control signal PEQ may be inactivated. The pre-charge circuit 653 may include NMOS transistors N3, N4 and N5.

The column select switches 654a and 654b may connect data sensed by the N-type and P-type sense amplifiers 651 and 652 to input/output lines LIO and LIOB in response to a column selection signal CSL. The column select switches 654a and 654b may be turned on such that the sensed data is transferred to the input/output lines LIO and LIOB. For example, in a read operation when sensing levels of the N-type and P-type sense amplifiers 651 and 652 are stabilized, a column selection signal CSL may be activated. Then the column select switches 654a and 654b may be turned on such that the sensed data is transferred to the local I/O line pair LIO and LIOB. Voltages of the bit-lines BL and BLB may be varied when charges of bit-lines BL and BLB are shared with the input/output lines LIO and LIOB. The column select switches 654a and 654b may include NMOS transistors N6 and N7.

The NSA driver 655 may provide a driving signal to the sense enable line LAB of the N-type sense amplifier 651. The NSA driver 655 may receive the control signal LANG from the bit-line control signal generator 520 (FIG. 9). Based on the control signal LANG, the NSA driver 655 may ground the sense enable line LAB. The NSA driver 655 may include the ground transistor N1 to control a voltage of the sense enable line LAB. The PSA driver 656 may provide the charge voltage VDD to the sense enable line LA of the P-type sense amplifier 652. The PSA driver 656 may be controlled by the control signal LAPG from the bit-line control signal generator 520. The control signals LAPG and LANG may be complementary to each other.

Figure 13:
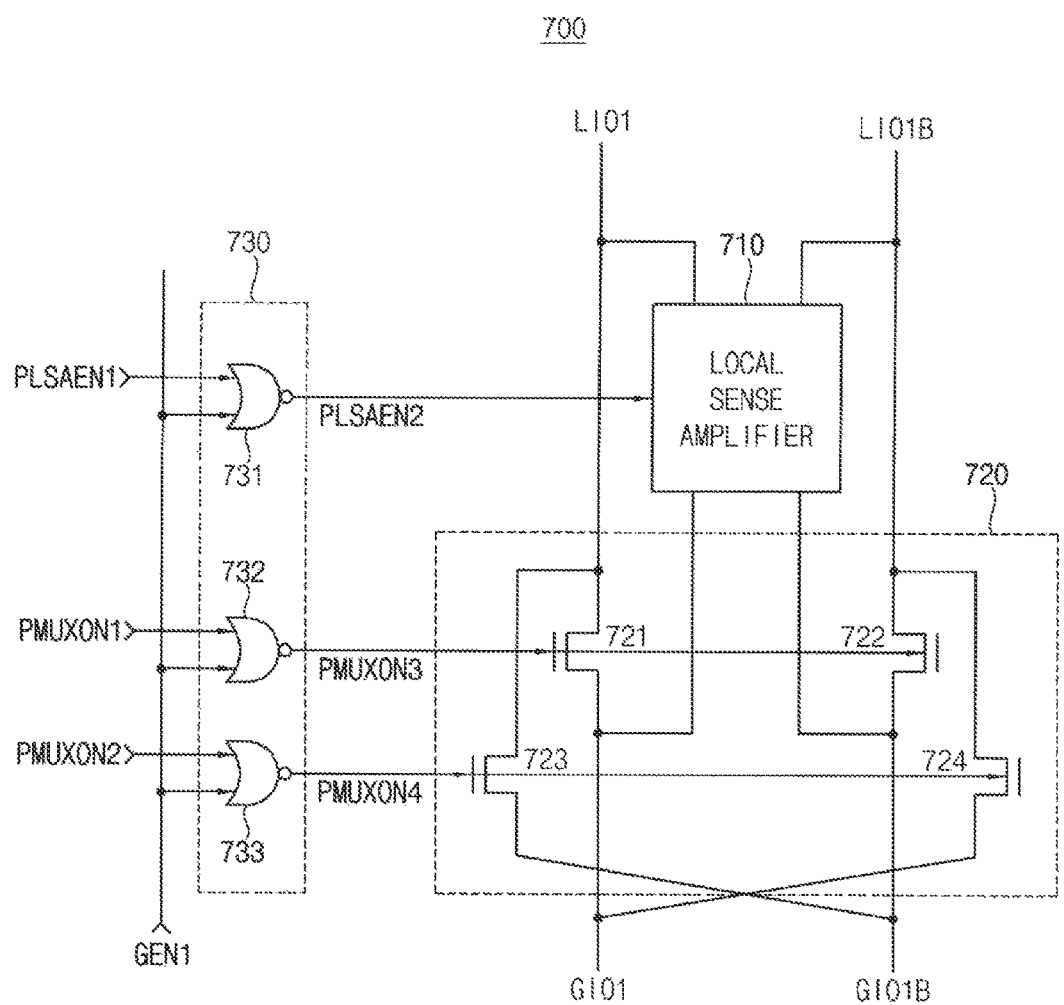
FIG. 13 illustrates the local sense amplifier circuit in FIG. 11.

FIG. 13 illustrates the local sense amplifier circuit in FIG. 11.

Referring to FIG. 13, the local sense amplifier circuit 700 may include a local sense amplifier 710, a local I/O line controller 720 and an activation control circuit 730.

The activation control circuit 730 may perform an XOR operation on the gate enable signal GEN1 and each of a first local sense enable signal PLSAEN1, a first connection control signal PMUXON1 and a second connection control signal PMUXON2, and output a second local sense enable signal PLSAEN2, a third connection control signal PMUXON3 and a fourth connection control signal PMUXON4. Therefore, each logic level of the second local sense enable signal PLSAEN2, the third connection control signal PMUXON3 and the fourth connection control signal PMUXON4 may be same as or may be opposite to each logic level of the first local sense enable signal PLSAEN1, the first connection control signal PMUXON1 and the second connection control signal PMUXON2 according to a logic level of the gate enable signal GEN1. The activation control circuit 730 may include first through third gates 731, 732 and 733.

The local sense amplifier 710 may amplify a voltage difference between the local I/O line pair LIO1 and LIOB1 in response to the second local sense enable signal PLSAEN2 to provide the amplified voltage difference to the global I/O line pair GIO1 and GIOB1. The local I/O line controller 720 may include first through fourth NMOS transistors 721, 722, 723 and 724 and control connection between the local I/O line pair LIO1 and LIOB1 and the global I/O line pair GIO1 and GIOB1 in response to the third connection control signal PMUXON3 and the fourth connection control signal PMUXON4.

For example, when each of the first local sense enable signal PLSAEN1, the first connection control signal PMUXON1 and the second connection control signal PMUXON2 is a high level and the gated enable signal GEN1 is a high level, each of the second local sense enable signal PLSAEN2, the third connection control signal PMUXON3 and the fourth connection control signal PMUXON4 may become a low level. Therefore, the local sense amplifier 710 may be disabled and the local I/O line controller 720 may cut off the connection between the local I/O line pair LIO1 and LIOB1 and the global I/O line pair GIO1 and GIOB1.

For example, when each of the first local sense enable signal PLSAEN1, the first connection control signal PMUXON1 and the second connection control signal PMUXON2 is a high level and the gated enable signal GEN1 is a low level, each of the second local sense enable signal PLSAEN2, the third connection control signal PMUXON3 and the fourth connection control signal PMUXON4 may become a high level. Therefore, the local sense amplifier 710 may be enabled and the local I/O line controller 720 may provide the connection between the local I/O line pair LIO1 and LIOB1 and the global I/O line pair GIO1 and GIOB1.

Figure 14:
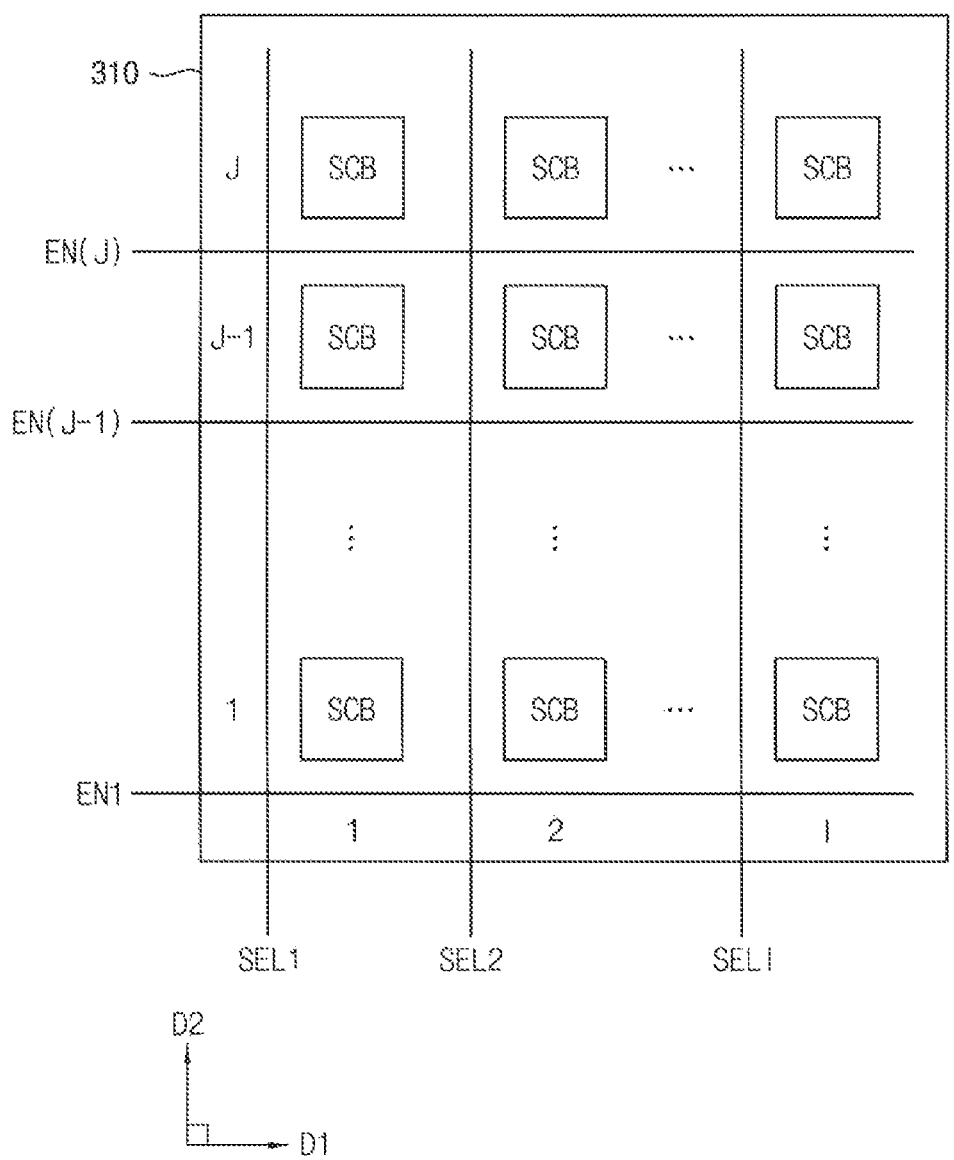
FIG. 14 illustrates arrangement of signal lines that transfer the enable signal and the selection signal in the first bank array of FIG. 10.

FIG. 14 illustrates arrangement of signal lines that transfer the enable signal and the selection signal in the first bank array of FIG. 10.

Referring to FIG. 14, signal lines that transfer enable signals EN1-ENj may extend in the first direction D1 and signal lines that transfer selection signals SEL1-SELI may extend in the second direction with respect to each sub-array block SCB in the first bank array 310. Each of the enable signals EN1-ENJ and each of the selection signals SEL1-SELI may be provided to a corresponding block control circuit in the conjunction region CONJ, and the corresponding block control circuit may enable or disable the associated sub-array block SCB in response to corresponding one of the enable signals EN1-ENJ and corresponding one of the selection signals SEL1-SELI. That is, the repair control circuit 400 may perform the column repair operation by unit of a sub-array block.

Figure 15:
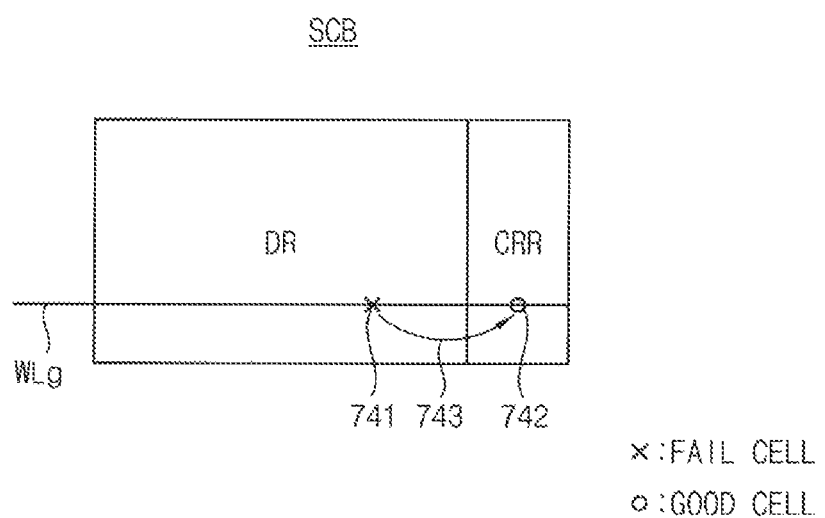
FIG. 15 illustrates one sub-array block in the bank array of FIG. 14.

FIG. 15 illustrates one sub-array block in the bank array of FIG. 14.

Referring to FIG. 15, the sub-array block SCB may include a data region DR and a column redundancy region CRR. Redundancy memory cells in the column redundancy region CRR may be used to repair the defective cell in the data region DR.

In FIG. 15, a defective cell 741 in the data region DR and a good cell 742 in the column redundancy region CRR for replacing the defective cell 741 may be coupled to a same word-line WLg. When the fuse information FI of the word-line WLg is a low level and the column repair signal CRP is activated, the defective cell 741 in the data region DR may be replaced with the good cell 742 in the column redundancy region CRR.

Figure 16:
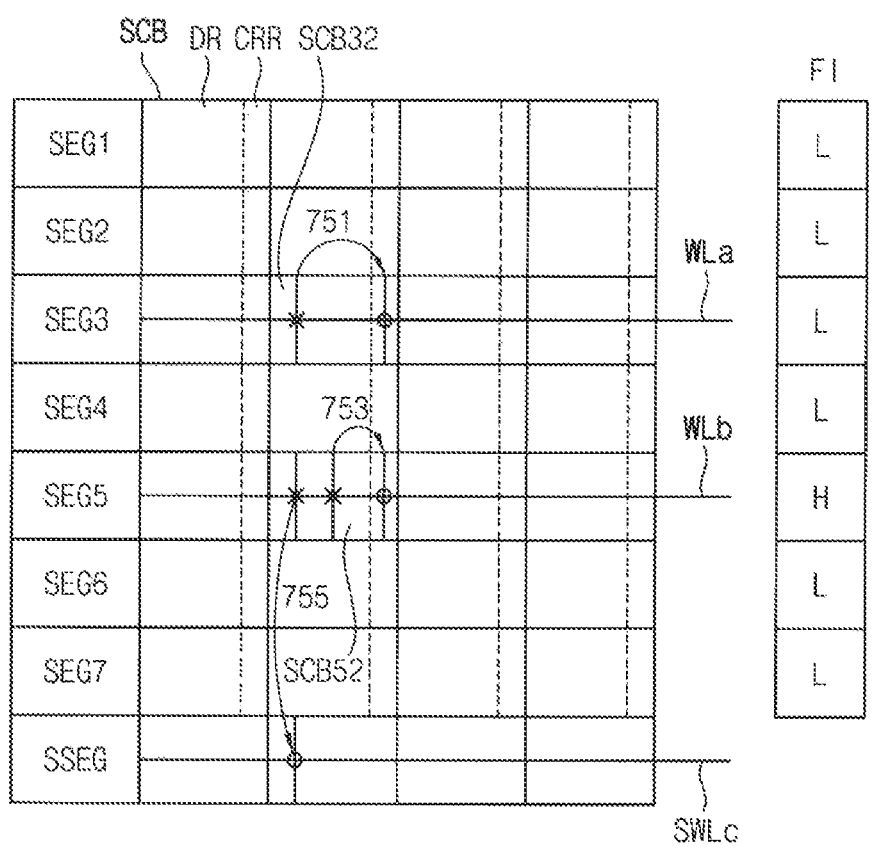
FIG. 16 illustrates the bank array of FIG. 14.

FIG. 16 illustrates the bank array of FIG. 14.

Referring to FIG. 16, the bank array may be divided into a plurality of segments SEG1-SEG7 based on the access row address. The fuse information FI of the segment SEG5 may be a high level and fuse information FI of each of the segments SEG1-SEG4, SEG6 and SEG7 may be a low level. Therefore, the segments SEG1-SEG4, SEG6 and SEG7 may constitute the first cell region and the segment SEG5 may constitute the second cell region. A spare segment SSEG may belong to one of the first cell region and the second cell region.

As described above, the sub-array block SCB may include the data region DRR and the column redundancy region CRR, and each sub-array block in the spare segment SSEG may include spare cell to repair the sub-array block in the segments SEG1-SEG7.

Since a sub-array block SCB32 belongs to the segment SEG3, is coupled to a word-line WLa, includes a defective cell, and the fuse information FI of the sub-array block SCB32 is a low level, the defective cell in the sub-array block SCB32 may be replaced with a good cell in the column redundancy region CRR in the sub-array block SCB32 as a reference numeral 751 indicates.

Since a sub-array block SCB52 belongs to the segment SEG5, is coupled to a word-line WLb, includes defective cells, and the fuse information FI of the sub-array block SCB52 is a high level, the word-line WLa and a spare word-line SWLc in the spare segment SSEG may be simultaneously activated. The spare word-line SWLc may correspond to the word-line WLb. In addition, at least one of the defective cells in the sub-array block SCB52 may be replaced with a good cell in the column redundancy region CRR in the sub-array block SCB52 as a reference numeral 753 indicates, and at least another of the of the defective cells in the sub-array block SCB52 may be replaced with a good cell in the spare segment SSEG1 as a reference numeral 755 indicates. The fuse information FI of the spare segment SSEG may be a high level or a low level. In another example embodiment, the spare segment SSEG may be allotted to the bank array regardless of the fuse information FI. Therefore, the semiconductor memory device 200 may increase flexibility when performing column repair operation.

Figure 17:
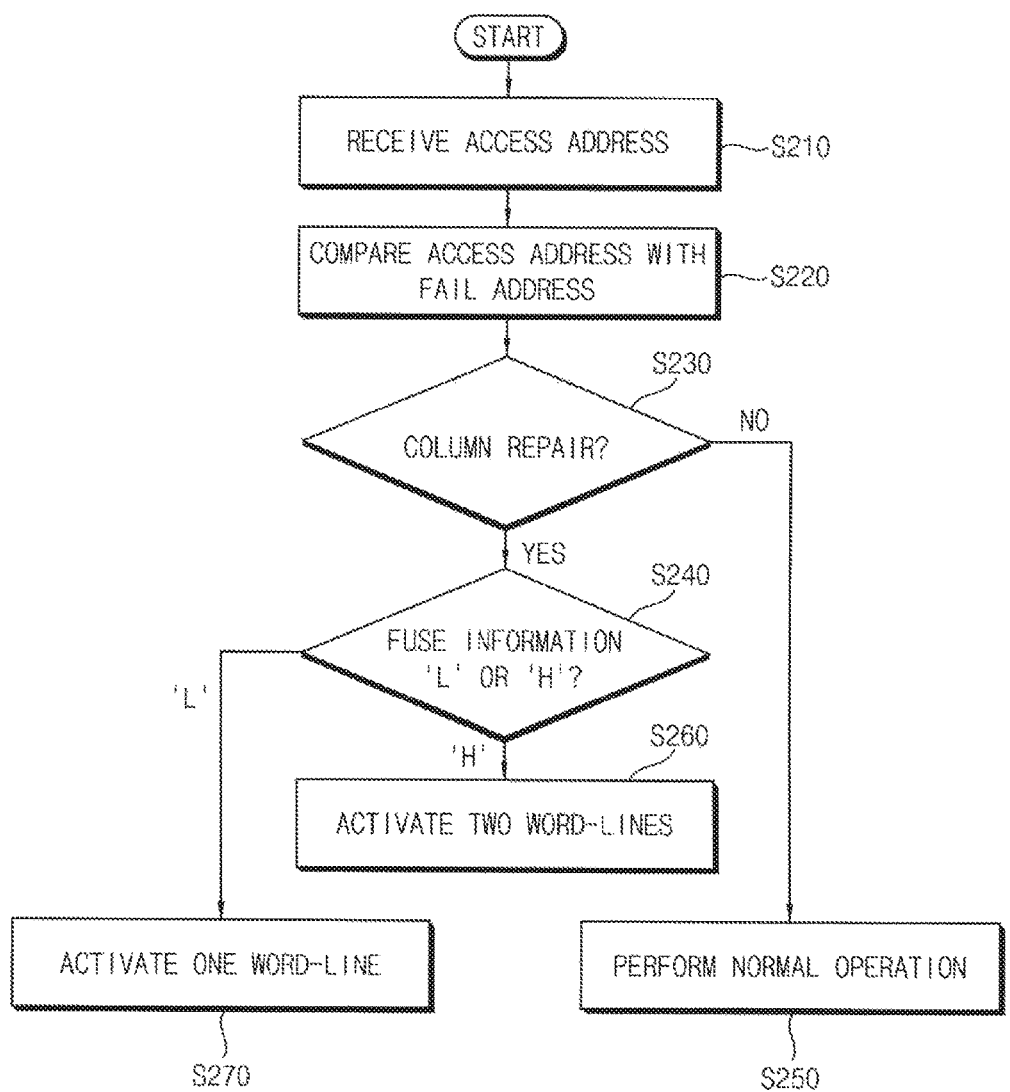
FIG. 17 is a flow chart illustrating a method of operating a semiconductor memory device according to an example embodiment.

FIG. 17 is a flow chart illustrating a method of operating a semiconductor memory device according to an example embodiment.

Referring to FIGS. 2 through 17, in a method of operating a semiconductor memory device including a first cell region and a second cell region which are identified by the fuse information, the repair control circuit 400 may receive the access address ADDR (S210). The address comparison circuit 405 in the repair control circuit 400 may compare the access address ADDR with the fail address information (S220).

The repair control circuit 400 may determine whether to perform a column repair operation on at least one defective cell in the memory cell array 300 based on a result of the comparison (S230). When the repair control circuit 400 determines not to perform the column repair operation on at least one defective cell ("NO" in S230), the control logic circuit 210 may perform a normal memory operation on the memory cell designated by the access address ADDR (S250).

When the repair control circuit 400 determines to perform the column repair operation on at least one defective cell ("YES" in S230), the repair control circuit 400 may determine whether the fuse information FI of a word-line designated by the access address is a low level or a high level (S240). When the fuse information FI of the word-line designated by the access address is a low level, the column repair operation may be performed by activating the word-line designated by the access address (S270). When the fuse information FI of the word-line designated by the access address is a high level, however, the column repair operation may be performed by activating the word-line designated by the access address and a spare word-line corresponding to the word-line simultaneously (S280). The spare word-line may be a word-line belonging to the first cell region or may be a word-line belonging to the second cell region.

Figure 18:
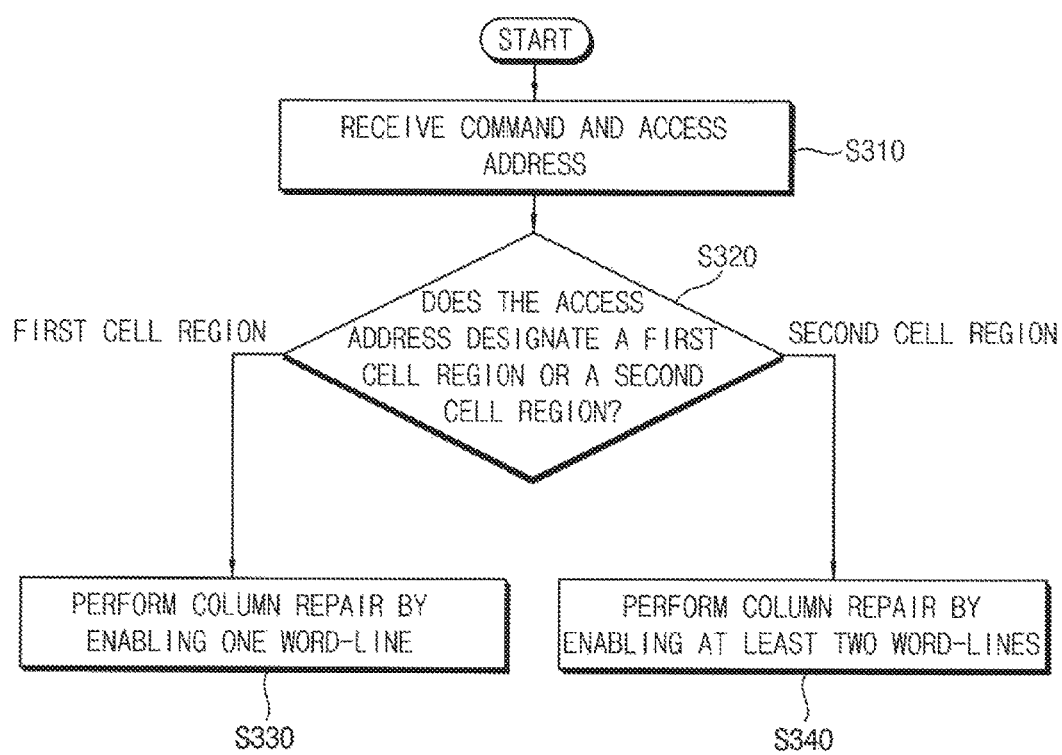
FIG. 18 is a flow chart illustrating a method of operating a semiconductor memory device according to an example embodiment.

FIG. 18 is a flow chart illustrating a method of operating a semiconductor memory device according to an example embodiment.

Referring to FIGS. 2 through 16 and 18, in a method of operating a semiconductor memory device 200 that includes a memory cell array 300 including a plurality of bank arrays, at least one of which includes a first cell region and a second cell region, the semiconductor memory device 200 may receive the command CMD and the access address ADDR from an external device (such as the memory controller 100) (S310).

The repair control circuit 400 may determine whether the access address ADDR accesses the first cell region or the second cell region based on the fuse information FI of each of the word-lines in the first cell region and the word-lines of the second cell region (S320). When the access address ADDR accesses the first cell region, a column repair operation may be performed by activating one of the word-liens in the first cell region (S330). When the access address ADDR accesses the second cell region, a column repair operation may be performed by simultaneously activating one of the word-liens in the first cell region and a spare word-line corresponding to the word-line (S340). The spare word-line may be one of the word-lines in the first cell region, one of the word-lines in the second cell region or one of word-lines in a third cell region different from the first cell region and the second cell region.

Figure 19:
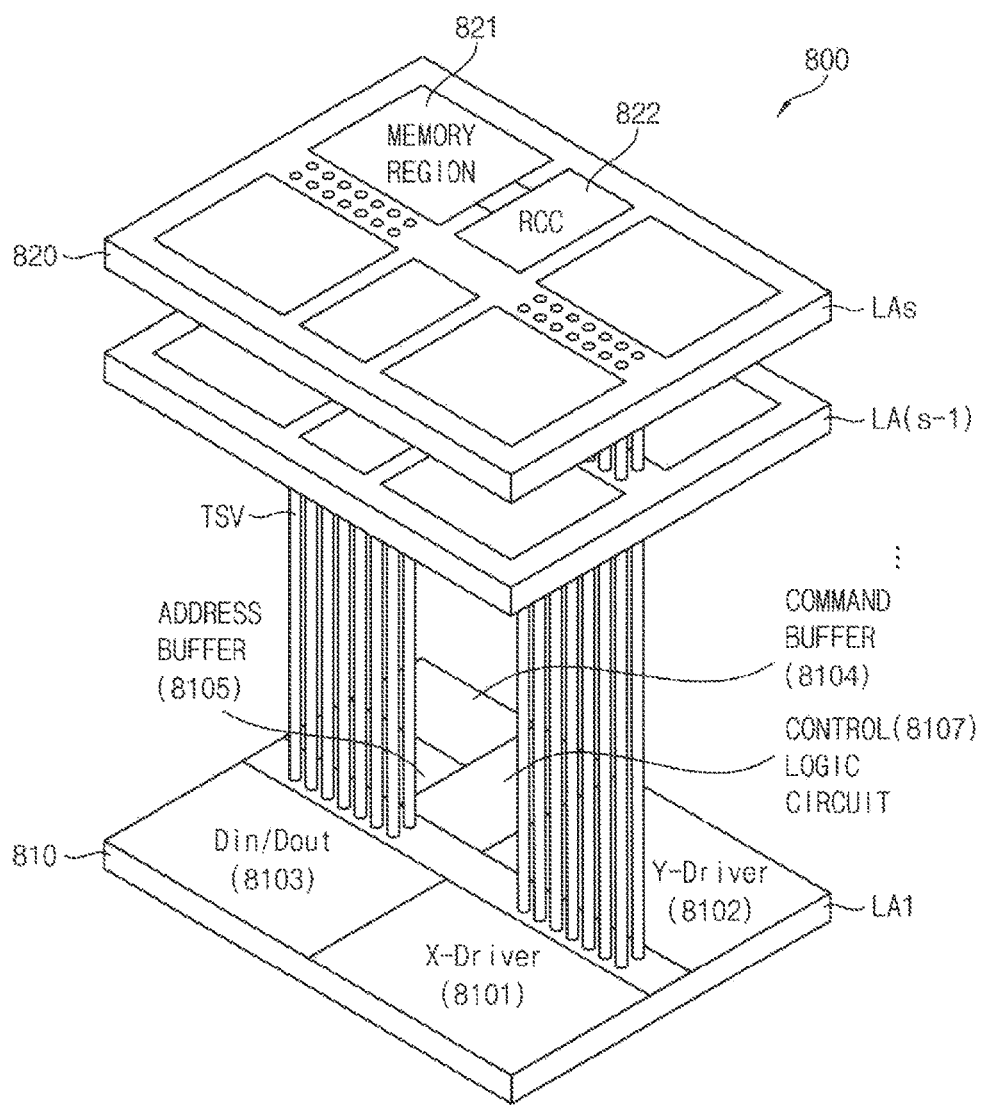
FIG. 19 is a structural diagram illustrating a semiconductor memory device according to an example embodiment.

FIG. 19 is a structural diagram illustrating a semiconductor memory device according to an example embodiment.

Referring to FIG. 19, a semiconductor memory device 800 may include first through s-th semiconductor integrated circuit layers LA1 through LAs (where s is a natural number greater than two), in which the lowest first semiconductor integrated circuit layer LA1 is assumed to be an interface or control chip and the other semiconductor integrated circuit layers LA2 through LAs are assumed to be slave chips including core memory chips. The first through s-th semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 800 by mainly using the first semiconductor integrated circuit layer LA1 or 810 as the interface or control chip and the s-th semiconductor integrated circuit layer LAs or 820 as the slave chip.

The first semiconductor integrated circuit layer 810 may include various peripheral circuits for driving a memory region 821 provided in the s-th semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer (CMD) 8104 for receiving a command CMD from outside and buffering the command CMD and an address buffer (ADDR) 8105 for receiving an address and buffering the address.

The first semiconductor integrated circuit layer 810 may further include a control logic circuit 8107. The control logic circuit 8107 may access the memory region 821 based on the command and the address from a memory controller. Conjunction regions may be disposed in the memory region 821 and the above-described block control circuits may be disposed in the conjunction regions.

The s-th semiconductor integrated circuit layer 820 may include the memory region 821, a repair control circuit 822 that controls repair operation of at least one defective cell in the memory region 821 and a peripheral region in which peripheral circuits such as a row decoder, a column decoder and a bit-line sense amplifier are disposed for writing/reading data in the memory region 821.

As described with reference to FIGS. 2 through 18, the memory region 821 may include a first cell region and a second cell region identified by the fuse information. When the repair control circuit 822 performs a column repair operation on the second cell region, the repair control circuit 822 may increase flexibility when performing the column repair operation by activating a word-line in the second cell region and another word-line.

In addition, in some embodiments, a three dimensional (3D) memory array may be provided in semiconductor memory device 800. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 20:
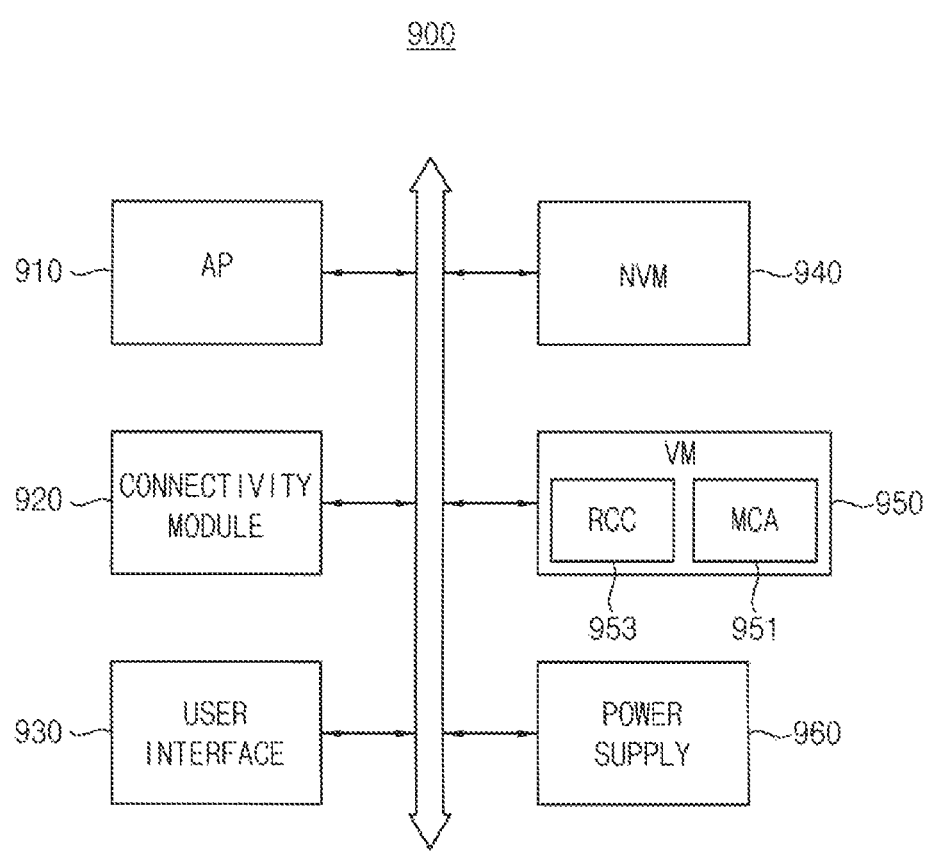
FIG. 20 is a block diagram illustrating a mobile system including the semiconductor memory device according to an example embodiment.

FIG. 20 is a block diagram illustrating a mobile system including the semiconductor memory device according to an example embodiment.

Referring to FIG. 20, a mobile system 900 may include an application processor 910, a connectivity module 920, a volatile memory device 950, a nonvolatile memory device 940, a user interface 930 and a power supply 960. One or more of these components may be connected to each other and communicate with each other via a bus.

The application processor 910 may execute applications, such as a web browser, a game application, a video player, etc. The connectivity module 920 may perform wired or wireless communication with an external device. The volatile memory device 950 may store data processed by the application processor 910 or operate as a working memory (i.e., primary storage). The volatile memory device 950 may employ the semiconductor memory device 200 of FIG. 3A. The volatile memory device 950 may include a memory cell array 951 and a repair control circuit 953. The repair control circuit 953 may repair at least one defective cell in the memory cell array 951.

The nonvolatile memory device 940 may store a boot image for booting the mobile device 900. The user interface 930 may include at least one input device, such as a keypad, a touch screen, etc., and at least one output device, such as a speaker, a display device, etc. The power supply 960 may supply a power supply voltage to the mobile system 900.

In some embodiments, the mobile system 900 and/or components of the mobile device 900 may be packaged in various forms.

As described above, the volatile memory device 950 may increase flexibility when performing a column repair operation by activating two word-lines simultaneously.

Aspects of the present disclosure may be applied to systems using semiconductor memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
a memory cell array comprising a plurality of bank arrays, at least one of the plurality of bank arrays comprising a first cell region and a second cell region; and
an access control circuit configured to access the first cell region and the second cell region differently, based on a command, an access address and fuse information that identifies the first cell region and the second cell region,
wherein the command and the access address are provided from an external device,
wherein the fuse information has a first logic level with respect to each of word-lines included in the second cell region, and
wherein the fuse information has a second logic level with respect to each of word-lines included in the first cell region.

2. The semiconductor memory device of claim 1, wherein the access control circuit is further configured to, based on the fuse information:
activate a first number of word-lines when the access address accesses the first cell region; and
activate a second number of word-lines when the access address accesses the second cell region, and
wherein the first number is different from the second number.

3. The semiconductor memory device of claim 2, wherein the second number of word-lines corresponds to a set of word-lines among all word-lines included in the first cell region and the second cell region.

4. The semiconductor memory device of claim 3, wherein the access control circuit is further configured to, when the access address accesses the second cell region, simultaneously activate a first word-line and a second word-line, the first word-line being designated by the access address and the second word-line being associated with the first word-line, and
wherein the first word-line is included in the second cell region, and the second word-line is included in one of the first cell region and the second cell region.

5. The semiconductor memory device of claim 1, wherein the memory cell array further comprises a third cell region that is not associated with the fuse information.

6. The semiconductor memory device of claim 5, wherein the access control circuit is further configured to, based on the fuse information:
activate a first number of word-lines when the access address accesses the first cell region; and
activate a second number of word-lines when the access address accesses the second cell region, and
wherein the first number is different from the second number.

7. The semiconductor memory device of claim 6, wherein the second number of word-lines corresponds to a set of word-lines among all word-lines included in the second cell region, the third cell region, and the first cell region.

8. The semiconductor memory device of claim 7, wherein the access control circuit is further configured to, when the access address accesses the second cell region, simultaneously activate a first word-line and a second word-line, the first word-line being designated by the access address and the second word-line being associated with the first word-line, and
wherein the first word-line is included in the second cell region, and the second word-line is included in one of the first cell region, the second cell region and the third cell region.

9. The semiconductor memory device of claim 1, wherein the access control circuit comprises:

a control logic circuit configured to generate an operation control signal to control operation of the memory cell array, based on the command and the access address;

a repair control circuit configured to generate repair control signals to control repair operation of the first cell region and the second cell region, based on the access address; and a timing control circuit configured to generate a first control signal to control word-lines of the memory cell array and a second control signal to control bit-lines of the memory cell array, in response to the operation control signal.

10. The semiconductor memory device of claim 9, wherein the repair control circuit comprises:
an address comparison circuit configured to:
compare the access address with address information of at least one defective cell that is generated in the first cell region and the second cell region; and
output a column repair signal to repair the at least one defective cell, based on a result of the access address being compared with the address information; and
a fuse information circuit configured to:
store the fuse information corresponding to a row address of the access address and a spare row address for replacing the row address; and
selectively output the spare row address according to the fuse information.

11. The semiconductor memory device of claim 10, wherein the address comparison circuit comprises:
a fail address storing table configured to store row address information and column address information of the at least one defective cell;
a row address comparator configured to:
store the row address information of the at least one defective cell; and
output a row match signal, based on a result of comparison of the row address of the access address and the row address information of the at least one defective cell; and
a column address comparator configured to:
store the column address information of the at least one defective cell; and
output the column repair signal, based on a result of comparison of a column address of the access address and the column address information of the at least one defective cell.

12. The semiconductor memory device of claim 10, wherein the fuse information circuit comprises:
a fuse table configured to store first row addresses of the word-lines in the first cell region, second row addresses of the word-lines in the second cell region, the fuse information and spare row addresses corresponding to the second row addresses respectively; and
a sensing circuit configured to output the spare row address corresponding to the row address of the access address, when the fuse information of the row addresses of the access address has the first logic level.

13. The semiconductor memory device of claim 9, wherein each of the plurality of bank arrays comprises:
a plurality of sub-array blocks disposed in a first direction of a substrate and a second direction crossing the first direction;
a plurality of sub word-line driver regions disposed between the plurality of sub-array blocks in the first direction;

a plurality of bit-line sense amplifier regions disposed between the plurality of sub-array blocks in the second direction; and a plurality of conjunction regions, each of the plurality of conjunction regions being disposed adjacent to a respective one of the plurality of sub word-line driver regions and a respective one of the plurality of bit-line sense amplifier regions.

14. The semiconductor memory device of claim 13, wherein each of the plurality of bank arrays further comprises:
a plurality of block control circuits disposed in the plurality of conjunction regions; and
a plurality of local sense amplifier circuits disposed in the plurality of bit-line sense amplifier regions,
wherein each of the plurality of block control circuits is configured to perform a column repair by selectively activating one of the plurality of local sense amplifier circuits in a corresponding sub-array block, in response to a selection signal and an enable signal of the repair control signals.

15. The semiconductor memory device of claim 13, wherein the repair control circuit is further configured to, when the access address designates one of the word-lines in the second cell region, perform a column repair by a unit of a sub-array block.

16. The semiconductor memory device of claim 1, wherein each of the plurality of bank arrays comprises the first cell region.

17. A method of operating a semiconductor memory device that includes a memory cell array including a plurality of bank arrays, at least one of the plurality of bank arrays including a first cell region and a second cell region, the method comprising:
receiving a command and an access address from an external device;
based on the command being received, determining whether the access address accesses the first cell region or the second cell region; and
accessing the first cell region and the second cell region differently, based on whether the access address is determined to access the first cell region or the second cell region and fuse information that identifies the first cell region and the second cell region,
wherein the fuse information has a first logic level with respect to each of word-lines included in the second cell region, and
wherein the fuse information has a second logic level with respect to each of word-lines included in the first cell region.

18. The method of claim 17, wherein the accessing the first cell region and the second cell region differently comprises:
activating a first number of word-lines based on the fuse information when the access address accesses the first cell region; and
activating a second number of word-lines based on the fuse information when the access address accesses the second cell region, and
wherein the first number is different from the second number.

19. A semiconductor memory device comprising:
a memory cell array comprising a plurality of bank arrays, at least one of the plurality of bank arrays comprising a first cell region and a second cell region; and
an access control circuit configured to determine to activate the first cell region and the second cell region simultaneously, or active one of the first cell region and the second cell region, based on an access address and fuse information that identifies the first cell region and the second cell region, wherein the access address is provided from an external device, wherein the fuse information has a first logic level with respect to each of word-lines included in the second cell region, and wherein the fuse information has a second to logic level with respect to each of word-lines included in the first cell region.

20. The semiconductor memory device of claim 19, wherein the access control circuit is configured to, when the first cell region and the second cell region are determined to be activated simultaneously, repair a defective cell in the second cell region, using a normal cell in the first cell region.

* * * * *